(12) United States Patent
Choi et al.

(10) Patent No.: US 9,346,912 B2
(45) Date of Patent: May 24, 2016

(54) POLYMER AND ORGANIC LIGHT-EMITTING DEVICE INCLUDING THE SAME

(75) Inventors: Hyeon-ho Choi, Seoul (KR); Jhun-mo Son, Yongin-si (KR); Ho-suk Kang, Seoul (KR); Hye-yeon Yang, Seoul (KR); Yong-sik Jung, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 797 days.

(21) Appl. No.: 13/606,879

(22) Filed: Sep. 7, 2012

(65) Prior Publication Data
US 2013/0240843 A1    Sep. 19, 2013

(30) Foreign Application Priority Data
Sep. 9, 2011 (KR) ........................ 10-2011-0092224

(51) Int. Cl.
| | |
|---|---|
| *H01L 51/54* | (2006.01) |
| *C09K 11/06* | (2006.01) |
| *C08G 61/12* | (2006.01) |
| *H01L 51/00* | (2006.01) |
| *H05B 33/20* | (2006.01) |
| *H01L 51/52* | (2006.01) |
| *H01L 51/50* | (2006.01) |

(52) U.S. Cl.
CPC ............ *C08G 61/122* (2013.01); *C08G 61/124* (2013.01); *H01L 51/0035* (2013.01); *H01L 51/0043* (2013.01); *H01L 51/5203* (2013.01); *H05B 33/20* (2013.01); *C08G 2261/312* (2013.01); *C08G 2261/3142* (2013.01); *C08G 2261/3241* (2013.01); *C08G 2261/95* (2013.01); *H01L 51/0037* (2013.01); *H01L 51/0067* (2013.01); *H01L 51/0085* (2013.01); *H01L 51/5016* (2013.01)

(58) Field of Classification Search
None
See application file for complete search history.

(56) References Cited

U.S. PATENT DOCUMENTS

| | | | |
|---|---|---|---|
| 2003/0094595 A1* | 5/2003 | Son et al. ............... | 252/301.16 |
| 2004/0072989 A1* | 4/2004 | Son et al. ................. | 528/397 |
| 2004/0202892 A1* | 10/2004 | Yasuda et al. ............. | 428/690 |
| 2007/0173633 A1 | 7/2007 | Son et al. | |
| 2010/0019658 A1 | 1/2010 | Lin et al. | |
| 2010/0133992 A1 | 6/2010 | Yang et al. | |

FOREIGN PATENT DOCUMENTS

| | | | | |
|---|---|---|---|---|
| CN | 1483783 | A | 3/2004 | |
| CN | 101007941 | A | 8/2007 | |
| EP | 1469057 | A2 | 10/2004 | |
| EP | 2182039 | A2 * | 5/2010 | ............ C09K 11/06 |
| JP | 2008-016827 | A | 1/2008 | |
| TW | 200427818 | A | 3/1993 | |
| WO | 2006013610 | A1 | 2/2006 | |
| WO | 2006063852 | A1 | 6/2006 | |
| WO | 2009067149 | A1 | 5/2009 | |

OTHER PUBLICATIONS

European Search Report for Application No. 12183531.8 dated Jan. 22, 2013.
Chinese Office Action dated Dec. 3, 2015.
English Translation of Chinese Office Action dated Dec. 3, 2015.
Simon Pesant et al. "First principles elaboration of low band gap ladder-type polymers", The Journal of Chemical Physics 130, 114906 (2009).

\* cited by examiner

*Primary Examiner* — Andrew K Bohaty
(74) *Attorney, Agent, or Firm* — Cantor Colburn LLP

(57) ABSTRACT

A polymer and an organic light-emitting device including the polymer represented by Formula 1

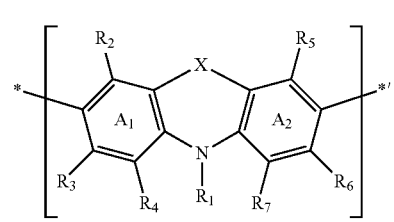

Formula 1 wherein at least one of a first dihedral angle between an $A_1$ ring of an $n^{th}$ repeating unit and a first aromatic ring of an $(n-1)^{th}$ repeating unit and a second dihedral angle between an $A_2$ ring of the $n^{th}$ repeating unit and a second aromatic ring of a $(n+1)^{th}$ repeating unit is equal to or greater than an angle of $\chi_{50\%}$ represented by Equation 1.

$$\chi_{50\%} = A + B(\phi + 4\theta)$$    Equation 1

18 Claims, 12 Drawing Sheets

POLYMER AND ORGANIC LIGHT-EMITTING DEVICE INCLUDING THE SAME

CROSS-REFERENCE TO RELATED APPLICATIONS

This application claims the benefit of Korean Patent Application No. 10-2011-0092224, filed on Sep. 9, 2011, and all the benefits accruing therefrom under 35 U.S.C. §119, the content of which is incorporated herein in its entirety by reference.

BACKGROUND

1. Field

The present disclosure relates to a polymer and an organic light-emitting device including the polymer.

2. Description of the Related Art

Organic light-emitting devices are self-emitting devices that are lightweight, can be easily manufactured using a relatively small number of components, and provide high-quality images with a wide viewing angle. Furthermore, organic light-emitting devices provide high color purity, accurately realize moving pictures, have low power consumption, and are operated at a low voltage. Due to these characteristics, organic light-emitting devices are suitable for various electronic applications such as mobile electronic devices.

A typical organic light-emitting device may have a structure in which an anode, a first layer, and a cathode are sequentially disposed on a substrate, wherein the first layer may include a hole transport layer ("HTL"), an emission layer ("EML"), and an electron transport layer ("ETL") sequentially disposed on the first layer.

When a current is applied between the anode and the cathode, holes injected from the anode move to the EML via the HTL, and electrons injected from the cathode move to the EML via the ETL. The holes and electrons recombine with each other in the EML to generate excitons. The excitons radiatively decay to emit light having a wavelength corresponding to the band gap of a corresponding material.

Materials for use in the first layer may include either vacuum-depositable materials or solution-coatable materials according to the method of forming the first layer. The solution-coatable materials should be miscible with a solvent to provide a composition that is coatable on a substrate, and the composition may be disposed on the substrate by a known solution coating method, such as inkjet printing, screen printing, or spin coating. Nonetheless, there remains a need for improved materials suitable for the first layer, including materials suitable for solution coating to provide the first layer.

SUMMARY

Provided is a polymer having a novel structure.

Provided is an organic light-emitting device ("OLED") including the polymer.

Additional aspects will be set forth in part in the description which follows and, in part, will be apparent from the description.

According to an embodiment, a polymer includes m repeating units, wherein an $n^{th}$ repeating unit of the m repeating units is a first repeating unit represented by Formula 1 below, wherein at least one of a first dihedral angle between an $A_1$ ring of the $n^{th}$ repeating unit and a first aromatic ring of an $(n-1)^{th}$ repeating unit and a second dihedral angle between an $A_2$ ring of the $n^{th}$ repeating unit and a second aromatic ring of a $(n+1)^{th}$ repeating unit is equal to or greater than an angle of $\chi_{50\%}$ represented by Equation 1:

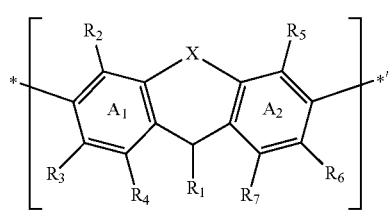

Formula 1

$$\chi_{50\%} = A + B(\phi + 4\theta) \quad \text{Equation 1}$$

wherein the first aromatic ring is bound to the $A_1$ ring by a single bond;

the second aromatic ring is bound to the $A_2$ ring by a single bond;

$R_1$ to $R_7$ of Formula 1 are each independently one of a hydrogen atom, a deuterium atom, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_{10}$-$C_{60}$ alkoxy group, a substituted or unsubstituted $C_3$-$C_{60}$ cycloalkyl group, a substituted or unsubstituted $C_{30}$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, $-N(Q_1)(Q_2)$, and $-Si(Q_3)(Q_4)(Q_5)$, wherein $Q_1$ to $Q_5$ are each independently a hydrogen atom, a deuterium atom, a halogen atom, a hydroxyl group, a cyano group, a nitro group, a carboxyl group, a $C_1$-$C_{60}$ alkyl group, a $C_2$-$C_{60}$ alkenyl group, a $C_2$-$C_{60}$ alkynyl group, a $C_3$-$C_{60}$ cycloalkyl group, a $C_6$-$C_{60}$ aryl group, or a $C_2$-$C_{60}$ heteroaryl group;

X of Formula 1 is absent, or a linker including carbon or a Group 16 element;

m is an integer from 2 to 1000;

n is a variable of from 2 to m−1;

A of Formula 1 is 26.03, and B is 0.0445;

$\phi$ of Equation 1 is an angle between the $A_1$ ring and $A_2$ ring of Formula 1, as illustrated in Formula 1-1 below; and $\theta$ of Equation 1 is an angle between a first imaginary line extending from a bond between the $A_1$ ring and an $A_3$ ring of Formula 1 in a direction close to nitrogen of the $A_3$ ring and a second imaginary line extending from a bond between the $A_2$ ring and $A_3$ ring in a direction close to the nitrogen of the $A_3$ ring, as illustrated in Formula 1-2 below.

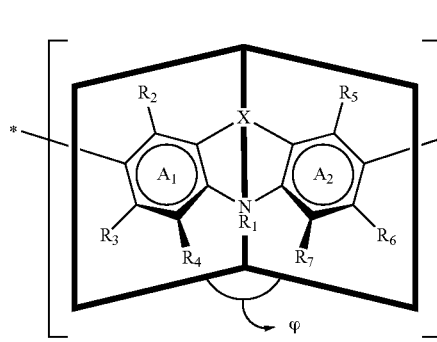

Formula 1-1

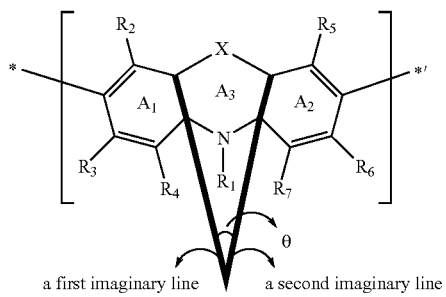

Formula 1-2

The polymer may be a phosphorescent host in an emission layer of an organic light-emitting device.

According to another embodiment, an organic light-emitting device includes: a substrate; a first electrode disposed on the substrate; a second electrode; and a first layer disposed between the first electrode and the second electrode, the first layer including the above-described polymer.

BRIEF DESCRIPTION OF THE DRAWINGS

These and other aspects, advantages and features of this disclosure will become apparent by describing in further detail embodiments thereof, with reference to the accompanying drawings in which.

DETAILED DESCRIPTION

Figure 1:
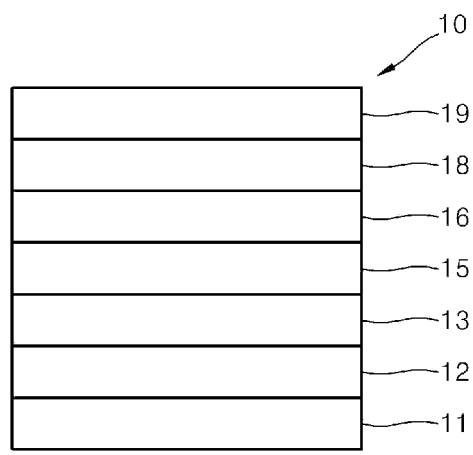
FIG. 1 is a schematic sectional view of an organic light-emitting device according to an embodiment as disclosed herein.

This disclosure will be described more fully hereinafter with reference to the accompanying drawings, in which various embodiments are shown. This disclosure may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout. As used herein, the term "and/or" includes any and all combinations of one or more of the associated listed items. Expressions such as "at least one of," when preceding a list of elements, modify the entire list of elements and do not modify the individual elements of the list.

In the drawings, the thickness of layers, films, panels, regions, etc., are not to scale for clarity.

It will be understood that when an element such as a layer, film, region, or substrate is referred to as being "on" or "disposed on" another element, it can be directly on the other element or intervening elements may also be present. In contrast, when an element is referred to as being "directly on" or "directly disposed on" another element, there are no intervening elements present.

The terminology used herein is for the purpose of describing particular embodiments only and is not intended to be limiting. As used herein, the singular forms "a," "an," and "the" are intended to include the plural forms as well, including "at least one," unless the content clearly indicates otherwise. "Or" means "and/or." It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning consistent with their meaning in the context of the relevant art and the present disclosure, and will not be interpreted in an idealized or overly formal sense unless expressly so defined herein.

According to an exemplary embodiment of the present disclosure, a polymer includes m repeating units, wherein an $n^{th}$ repeating unit of the m repeating units is a first repeating unit represented by Formula 1 below.

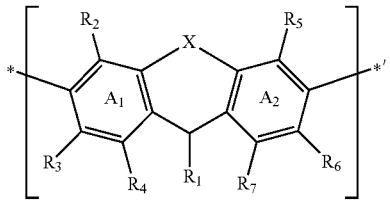

Formula 1

In Formula 1, m indicates the number of repeating units of the polymer, and is an integer from 2 to 1000, and in an embodiment, may be an integer from 10 to 200;

n is a variable from 2 to m−1; and

X may be the same or different in each repeating unit and is each independently absent, or a linker comprising a $C_1$-$C_7$ substituted or unsubstituted alkylene group or a Group 16 element.

For example, X of Formula 1 may be the linker comprising a $C_1$-$C_7$ substituted or unsubstituted alkylene group, absent, the linker represented by the Group 16 element —O—, the linker represented by the Group 16 element —S—, the linker represented by the Group 16 element —Se—, but is not limited thereto.

At least one of a first dihedral angle between an $A_1$ ring of the $n^{th}$ repeating unit and a first aromatic ring of an $(n-1)^{th}$ repeating unit and a second dihedral angle between an $A_2$ ring of the $n^{th}$ repeating unit and a second aromatic ring of a $(n+1)^{th}$ repeating unit of Formula 1, is equal to or greater than an angle of $\chi_{50\%}$ represented by Equation 1.

$$\chi_{50\%} = A + B(\phi + 4\theta)$$  Equation 1

In Equation 1, A is 26.03, and B is 0.0445.

In Equation 1, $\phi$ is an angle between the $A_1$ ring and $A_2$ ring of Formula 1, as illustrated in Formula 1-1 below, and $\theta$ is an angle between a first imaginary line extending from a bond between the $A_1$ ring and an $A_3$ ring of Formula 1 in a direction close to nitrogen of the $A_3$ ring and a second imaginary line extending from a bond between the $A_2$ ring and $A_3$ ring in a direction close to the nitrogen of the $A_3$ ring, as illustrated in Formula 1-2 below.

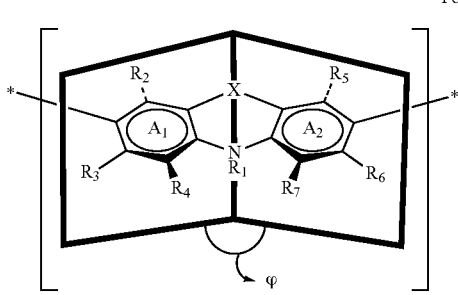

Formula 1-1

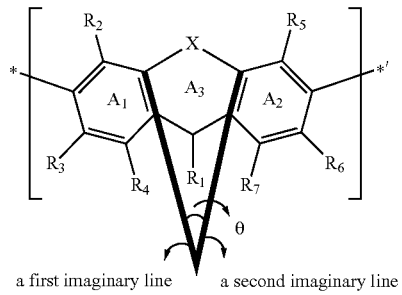

Formula 1-2 a first imaginary line    a second imaginary line

Formula 1-1 and Formula 1-2 are for describing $\phi$ and $\theta$ of Equation 1 with imaginary lines (first and second imaginary lines) and planes (of Formula 1-1 with the $A_1$ and $A_2$ rings thereon).

A first aromatic ring in the $(n-1)^{th}$ repeating unit is bound to the $A_1$ ring of the $n^{th}$ repeating unit via a single bond, and a second aromatic ring in the $(n+1)^{th}$ repeating unit is bound to the $A_2$ ring of the $n^{th}$ repeating unit via a single bond.

In Formula 1, $\phi$ and $\theta$ may be dependent on X.

For example, X may be the linker comprising a $C_1$-$C_7$ substituted or unsubstituted alkylene group represented by Formula 2-1.

$$-\!\!\!-\!C(R_8)(R_9)\!-\!\!\!-_a$$  Formula 2-1

$R_8$ and $R_9$ of Formula 2-1 may each independently be a hydrogen atom, a deuterium atom, a halogen, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_2$-$C_{60}$ cycloalkynyl group, a substituted or unsubstituted $C_3$-$C_{60}$ heterocycloalkyl group, a substituted or unsubstituted $C_3$-$C_{60}$ heterocycloalkenyl group, a substituted or unsubstituted $C_2$-$C_{60}$ heterocycloalkynyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted $C_2$-$C_{60}$ heteroaryloxy group, a substituted or unsubstituted $C_2$-$C_{60}$ heteroarylthio group, an isocyanate group, or a (meth)acrylate group.

In Formula 2-1, a is an integer ranging from 1 to 4.

In an embodiment, $R_8$ and $R_9$ of Formula 2-1 are each independently a hydrogen atom, a deuterium atom, a halogen, a hydroxyl group, a cyano group, a nitro group, a carboxyl group, a substituted or unsubstituted $C_1$-$C_{20}$ alkyl group, or a substituted or unsubstituted $C_1$-$C_{20}$ alkoxy group, but are not limited thereto.

For example, X may be the linker represented by Formula 2-2.

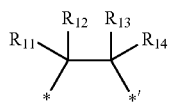

Formula 2-2

$R_{11}$ to $R_{14}$ of Formula 2-2 are each independently a hydrogen atom, a deuterium atom, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_2$-$C_{60}$ cycloalkynyl group, a substituted or unsubstituted $C_3$-$C_{60}$ heterocycloalkyl group, a substituted or unsubstituted $C_3$-$C_{60}$ heterocycloalkenyl group, a substituted or unsubstituted $C_2$-$C_{60}$ heterocycloalkynyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted $C_2$-$C_{60}$ heteroaryloxy group, a substituted or unsubstituted $C_2$-$C_{60}$ heteroarylthio group, an isocyanate group, a (meth)acrylate group, or a combination thereof.

In an embodiment, $R_{11}$ to $R_{14}$ of Formula 2-2 are each independently a hydrogen atom, a deuterium atom, a halogen atom, a hydroxyl group, a cyano group, a nitro group, a carboxyl group, a substituted or unsubstituted $C_1$-$C_{20}$ alkyl group, or a substituted or unsubstituted $C_1$-$C_{20}$ alkoxy group, but are not limited thereto.

For example, $R_{11}$ to $R_{14}$ of Formula 2-2 may be each independently at a hydrogen atom; a deuterium atom; —F; —Cl; a hydroxyl group; a cyano group; a nitro group; a carboxyl group; a methyl group; an ethyl group; a propyl group; an i-propyl group; a butyl group; an i-butyl group; a t-butyl group; a pentyl group; a hexyl group; a heptyl group; an octyl group; a 2-ethylhexyl group; a nonyl group; a decyl group; a 3,7-dimethyloctyl group; a methoxy group; an ethoxy group; a propyloxy group; an i-propyloxy group; a butoxy group; an i-butoxy group; a t-butoxy group; a pentyloxy group; a hexyloxy group; a heptyloxy group; an octyloxy group; a 2-ethylhexyloxy group; a nonyloxy group; a decyloxy group; or a 3,7-dimethyloctyloxy group. In addition, $R_{11}$ to $R_{14}$ of Formula 2-2 may be each independently a substituted group that is a methyl group, an ethyl group, a propyl group, an i-propyl group, a butyl group, an i-butyl group, a t-butyl group, a pentyl group, a hexyl group, a heptyl group, an octyl group, a 2-ethylhexyl group, a nonyl group, a decyl group, a 3,7-dimethyloctyl group a methoxy group, an ethoxy group, a propyloxy group, an i-propyloxy group, a butoxy group, a i-butoxy group, a t-butoxy group, a pentyloxy group, a hexyloxy group, a heptyloxy group, an octyloxy group, a 2-ethylhexyloxy group, a nonyloxy group, a decyloxy group, or a 3,7-dimethyloctyloxy group that are each substituted with a deuterium atom, —F, —Cl, a hydroxyl group, a cyano group, a nitro group, a carboxyl group, or a combination thereof, provided that the valence of the group is not exceeded.

For example, in Formula 2-2, $R_{11}$ to $R_{14}$ may be all hydrogen atoms.

When X of Formula 1 is the linker represented by Formula 2-2 above, $158.37 \leq \phi \leq 160.37$ (for example, $158.87 \leq \phi \leq 59.87$), $32.52 \leq \theta \leq 34.52$ (for example, $33.02 \leq \theta \leq 34.02$), and $38.00 \leq \chi_{50\%} \leq 40.00$ (for example, $38.50 \leq \chi_{50\%} \leq 39.50$) may be satisfied. In an embodiment, when X of Formula 1 is the linker represented by Formula 2-2, $159.17 \leq \phi \leq 159.57$, $33.32 \leq \theta \leq 33.72$, and $38.80 \leq \chi_{50\%} \leq 39.20$ may be satisfied.

When X of Formula 1 is absent, $\phi=180.00$; $-34.456 \leq \theta \leq -32.45$ (for example, $-33.95 \leq \theta \leq -32.95$), and $27.00 \leq \chi_{50\%} \leq 29.00$ (for example, $27.50 \leq \chi_{50\%} \leq 28.50$) may be satisfied. In an embodiment, when X of Formula 1 is absent, $\phi=180.00$, $-33.65 \leq \theta \leq -33.25$, and $27.80 \leq \chi_{50\%} \leq 28.20$ may be satisfied.

When X of Formula 1 is the linker represented by the Group 16 element —O—, $167.18 \leq \phi \leq 169.18$ (for example, $167.68 \leq \phi \leq 168.68$), $-2.81 \leq \theta \leq 0.81$ (for example, $-2.31 \leq \theta \leq -1.31$), and $32.00 \leq \chi_{50\%} \leq 34.00$ (for example, $32.50 \leq \chi_{50\%} \leq 33.50$) may be satisfied. In an embodiment, when X of Formula 1 is the linker represented by the Group 16 element —O—, $167.98 \leq \phi \leq 168.38$, $-2.01 \leq \theta -1.61$, and $32.80 \leq \chi_{50\%} \leq 33.20$ may be satisfied.

When X of Formula 1 is the linker represented by the Group 16 element —S—, $149.27 \leq \phi \leq 151.27$ (for example, $149.77 \leq \phi \leq 150.77$), $10.01 \leq \theta \leq 12.01$ (for example, $10.51 \leq \theta \leq 11.51$), and $34.00 0 \leq \chi_{50\%} \leq 36.00$ (for example, $34.50 \leq \chi_{50\%} \leq 35.50$) may be satisfied. In an embodiment, when X of Formula 1 is the linker represented by the Group 16 element —S—, $150.07 \leq \phi \leq 150.47$, $10.81 \leq \theta \leq 11.21$, and $34.80 \leq \chi_{50\%} \leq 35.20$ may be satisfied.

When X of Formula 1 is the linker represented by the Group 16 element —Se—, $145.940 \leq \phi \leq 147.94$ (for example, $146.44 \leq \phi \leq 47.44$), $14.46 \leq \theta \leq 16.46$ (for example, $14.96 \leq \theta \leq 15.96$), and $34.00 \leq \chi_{50\%} \leq 36.00$ (for example, $34.50 \leq \chi_{50\%} \leq 35.50$) may be satisfied. In an embodiment, when X of Formula 1 is the linker represented by the Group 16 element —Se—, $146.74 \leq \phi \leq 147.14$, $15.26 \leq \theta \leq 15.66$, and $34.80 \leq \chi_{50\%} \leq 35.20$ may be satisfied.

For example, $\phi$, $\theta$, and $\chi_{50\%}$ of Equation 1 may have the following values in Table 1 depending on X, but are not limited thereto.

TABLE 1

| X | $\phi$ (°) | $\theta$ (°) | $\chi_{50\%}$ (°) |
|---|---|---|---|
| Linker represented by Formula 2 (where $R_{11}$ to $R_{14}$ are all hydrogen atoms) | 159.37 | 33.52 | 39.08 |
| absent | 180.00 | −33.45 | 28.08 |
| —O— | 168.18 | −1.81 | 33.19 |
| —S— | 150.27 | 11.01 | 34.67 |
| —Se— | 146.94 | 15.46 | 35.32 |

$\phi$ and $\theta$ of Equation 1 may be calculated by the application of density functional theory ("DFT") with the B3LYP/6-31+G(D) basis set to a unit compound where $R_1$ to $R_7$ are all hydrogen atoms (i.e.,

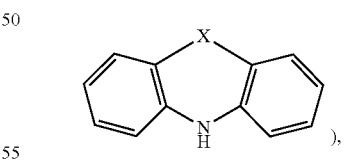

), and $\chi_{50\%}$ may be calculated using time-dependent density functional theory ("TDDFT"). TDDFT is a quantum mechanical theory used to investigate the properties and dynamics of body systems in the presence of time-dependent potentials, such as electric or magnetic fields, which has been suggested to describe the time dependency that is unexplainable with DFT, which is a quantum computation theory method, and may be applicable in describing the effects of such time-dependent electric or magnetic fields. TDDEF may be used for a calculation of the quantum state (e.g., energy, structure, or the like) of a target system in an excited state based on linear response theory to obtain absorption/emission spectra, or for interpretation of the excited state information.

When at least one of the first dihedral angle and the second dihedral angle of the polymer including the first repeating unit of Formula 1 above is equal to or greater than an angle of $\chi_{50\%}$ defined by Equation 1 above, the polymer may have a high triplet state energy, for example, such that the polymer is suitable for use as a phosphorescent host in an organic light-emitting device. Therefore, the polymer including the first repeating unit of Formula 1 may be a phosphorescent host of an organic light-emitting device.

An increased conjugation length in a polymer for use as an organic semiconductor may lead to a higher charge mobility, but at the same time, to a reduction in excited state energy of the polymer, which is not conducive to use as a phosphorescent host. Therefore, for availability as a phosphorescent host, designing a polymer with a conjugation structure that facilitates both an appropriate range of excited state energies as a phosphorescent host and reduced or no reduction in charge mobility is needed.

To date, essential measures and requirements for designing a polymer with a conjugation structure appropriate as a phosphorescent host are unknown. The inventors of the present disclosure found that with a polymer designed to include the first repeating unit of Formula 1 above in which at least one of the first dihedral angle and the second dihedral angle is equal to or greater than an angle of $\chi_{50\%}$ defined by Equation 1, an original conjugation length of the polymer may be maintained, and at the same time, a conjugation structure breakage effect in some regions of the polymer may be obtained due to tilting of the $n^{th}$ repeating unit with respect to the $n-1^{th}$ repeating unit and/or to the $n+1^{th}$ repeating unit of the polymer, which may maintain both the charge mobility and the excited state energy of the polymer high. Accordingly, the polymer may have a high triplet state energy, and thus may be a phosphorescent host of an organic light-emitting device.

As described above, a polymer having an effective triplet state energy may be designed using monomers that allow the target polymer to have a smallest dihedral angle (as defined above) that is equal to or greater than $\chi_{50\%}$ defined by Equation 1. Analysis of $\chi_{50\%}$ and dihedral angles of a polymer has a wide range of applications, for example, in predicting whether the polymer may provide an effective triplet state energy (i.e., its availability as a phosphorescent host of an organic light-emitting device).

Evaluation of the first and second dihedral angle angles of the polymer is possible via computational simulations of electronic structures. For example, the first dihedral angle and the second dihedral angle of a target polymer are predictable using DFT with the exchange-correlation potential functional (xc-functional) of B3LYP/6-31+G(D) and a basis set.

Dihedral angles of polymers may be experimentally measured using x-ray diffraction analysis. For example, a first dihedral angle of a polymer A below may be practically measured by X-ray diffraction analysis on carbazole having an —$OC_8H_{17}$ substituted phenyl group as illustrated in Formula A(1) below.

Polymer A: Polymer consisting of the following repeating unit

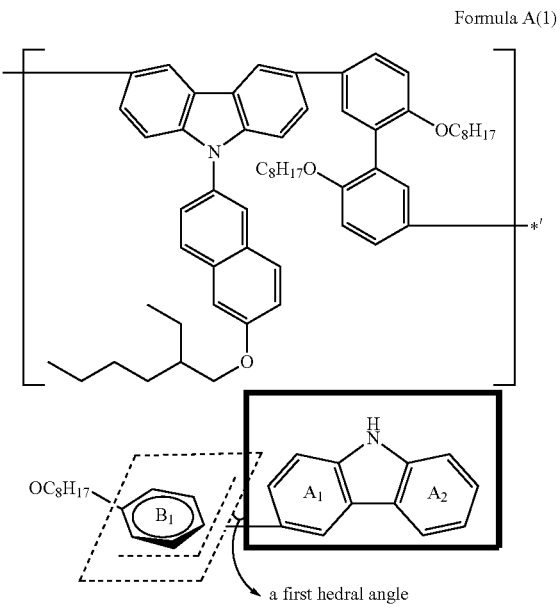

Formula A(1)

a first hedral angle

The triplet state energy of the polymer may be measured by analysis of peaks from photoluminescence (PL) spectra on a mixture of the polymer and toluene contained in a quartz cell.

Further in Formula 1, $R_1$ to $R_7$ may be each independently a hydrogen atom, a deuterium atom, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_{10}$-$C_{60}$ alkoxy group, a substituted or unsubstituted $C_3$-$C_{60}$ cycloalkyl group, a substituted or unsubstituted $C_{30}$-$C_{60}$ cycloalkenyl group, a substituted or unsubstituted $C_2$-$C_{60}$ cycloalkynyl group, a substituted or unsubstituted $C_3$-$C_{60}$ heterocycloalkyl group, a substituted or unsubstituted $C_3$-$C_{60}$ heterocycloalkenyl group, a substituted or unsubstituted $C_{20}$-$C_{60}$ heterocycloalkynyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted $C_2$-$C_{60}$ heteroaryloxy group, a substituted or unsubstituted $C_2$-$C_{60}$ heteroarylthio group, an isocyanate group, a (meth)acrylate group, —$N(Q_1)(Q_2)$, —$Si(Q_3)(Q_4)(Q_5)$ (wherein $Q_1$ to $Q_5$ are each independently a hydrogen atom, a deuterium atom, a halogen atom, a hydroxyl group, a cyano group, a nitro group, a carboxyl group, a $C_1$-$C_{60}$ alkyl group, a $C_2$-$C_{60}$ alkenyl group, a $C_2$-$C_{60}$ alkynyl group, a $C_3$-$C_{60}$ cycloalkyl group, a $C_6$-$C_{60}$ aryl group, a $C_2$-$C_{60}$ heteroaryl group, or a combination thereof), —$(Q_6)O(Q_7)$ (wherein $Q_6$ is a substituted or unsubstituted $C_1$-$C_{60}$ alkylene group and $Q_7$ is a hydrogen or a substituted or unsubstituted $C_1$-$C_{60}$ alkyl group), or a combination thereof.

For example, $R_1$ to $R_7$ in Formula 1 may be each independently a hydrogen atom, a deuterium atom, a halogen atom, a hydroxyl group, a cyano group, a nitro group, a carboxyl group, a substituted or unsubstituted $C_1$-$C_{20}$ alkyl group, a substituted or unsubstituted $C_1$-$C_{20}$ alkoxy group, a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted phenalenyl group, a substituted or unsubstituted phenanthryl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted pyrazolyl group, a substituted or unsubstituted imidazolyl group, a substituted or unsubstituted imidazolinyl group, a substituted or unsubstituted imidazopyridinyl group, a substituted or unsubstituted imidazopyrimidinyl group, a substituted or unsubstituted pyridinyl group, a substituted or unsubstituted pyrazinyl group, a substituted or unsubstituted pyrimidinyl group, a substituted or unsubstituted indolyl group, a substituted or unsubstituted purinyl group, a substituted or unsubstituted quinolinyl group, a substituted or unsubstituted phthalazinyl group, a substituted or unsubstituted indolizinyl group, a substituted or unsubstituted naphthyridinyl group, a substituted or unsubstituted quinazolinyl group, a substituted or unsubstituted cinnolinyl group, a substituted or unsubstituted indazolyl group, a substituted or unsubstituted carbazolyl group, a substituted or unsubstituted phenazinyl group, a substituted or unsubstituted phenanthridinyl group, a substituted or unsubstituted chromenyl group, a substituted or unsubstituted benzofuranyl group, a substituted or unsubstituted thiophenyl group, a substituted or unsubstituted benzothiophenyl group, a substituted or unsubstituted isothiazolyl group, a substituted or unsubstituted benzoimidazolyl group, or a substituted or unsubstituted isoxazolyl group.

For example, in Formula 1, $R_2$ to $R_7$ may each be a hydrogen atom, and $R_1$ may be represented by Formula 3A, 3B, 3C, 3D, 3E, 3F, 3G, 3H, or 3I.

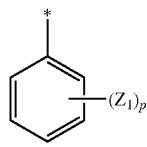

Formula 3A

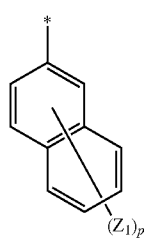

Formula 3B

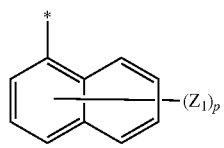

Formula 3C

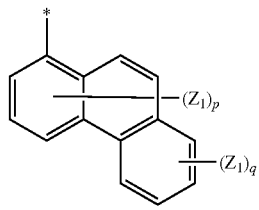

Formula 3D

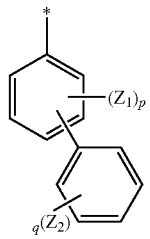

Formula 3E

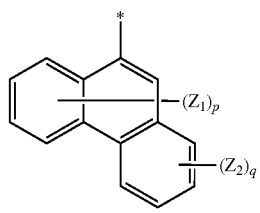

Formula 3F

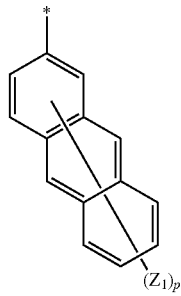

Formula 3G

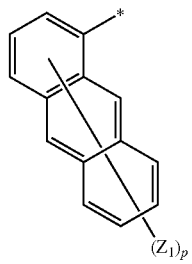

Formula 3H

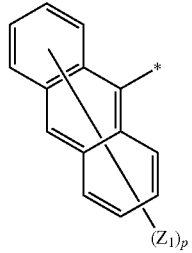

Formula 3I

In Formulae 3A to 3I, $Z_1$ and $Z_2$ may be each independently a deuterium atom, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_2$-$C_{60}$ cycloalkynyl group, a substituted or unsubstituted $C_3$-$C_{60}$ heterocycloalkyl group, a substituted or unsubstituted $C_3$-$C_{60}$ heterocycloalkenyl group, a substituted or unsubstituted $C_2$-$C_{60}$ heterocycloalkynyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted $C_2$-$C_{60}$ heteroaryloxy group, a substituted or unsubstituted $C_2$-$C_{60}$ heteroarylthio group, an isocyanate group, a (meth)acrylate group, or a combination thereof; p is an integer from 0 to 9; and q is an integer from 0 to 4.

For example, in Formulae 3A to 3I, $Z_1$ and $Z_2$ may be each independently a deuterium atom, a halogen atom, a hydroxyl group, a cyano group, a nitro group, a carboxyl group, a substituted or unsubstituted $C_1$-$C_{20}$ alkyl group, or a substituted or unsubstituted $C_1$-$C_{20}$ alkoxy group.

For example, $Z_1$ and $Z_2$ of Formulae 3A to 3I may be each independently a deuterium atom; —F; —Cl; a hydroxyl group; a cyano group; a nitro group; a carboxyl group; a methyl group; an ethyl group; a propyl group; an i-propyl group; a butyl group; an i-butyl group; a t-butyl group; a pentyl group; a hexyl group; a heptyl group; an octyl group; a 2-ethylhexyl group; a nonyl group; a decyl group; a 3,7-dimethyloctyl group; a methoxy group; an ethoxy group; a propyloxy group; an i-propyloxy group; a butoxy group; an i-butoxy group; a t-butoxy group; a pentyloxy group; a hexyloxy group; a heptyloxy group; an octyloxy group; a 2-ethylhexyloxy group; a nonyloxy group; a decyloxy group; or a 3,7-dimethyloctyloxy group. In addition, $Z_1$ and $Z_2$ of Formulae 3A to 3I may be each independently substituted group that is a methyl group, an ethyl group, a propyl group, an i-propyl group, a butyl group, an i-butyl group, a t-butyl group, a pentyl group, a hexyl group, a heptyl group, an octyl group, a 2-ethylhexyl group, a nonyl group, a decyl group, a 3,7-dimethyloctyl group, a methoxy group, an ethoxy group, a propyloxy group, an i-propyloxy group, a butoxy group, a i-butoxy group, a t-butoxy group, a pentyloxy group, a hexyloxy group, a heptyloxy group, an octyloxy group, a 2-ethylhexyloxy group, a nonyloxy group, a decyloxy group, or a 3,7-dimethyloctyloxy group that are each substituted with a deuterium atom, —F, —Cl, a hydroxyl group, a cyano group, a nitro group, a carboxyl group, or a combination thereof, provided that the valence of the group is not exceeded.

In Formulae 3A to 3I, p may be an integer from 0 to 3, and in an embodiment, may be an integer from 1 to 3; and q may be an integer from 0 to 2, and in an embodiment, may be an integer from 1 or 2, but p and q are not limited thereto.

For example, in Formula 1, $R_2$ to $R_7$ may each be a hydrogen atom, and $R_1$ may be represented by Formula 4A below, but $R_2$ to $R_7$ and $R_1$ are not limited thereto.

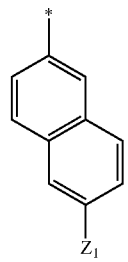

Formula 4A $Z_1$ in Formula 4A is the same as defined above for $Z_1$ in Formulae 3A to 3I, so a detailed description thereof will not be recited here.

The first aromatic ring and the second aromatic ring of the polymer comprising a repeating unit represented by Formula 1, may be substituted or unsubstituted benzene rings. For example, the first aromatic ring and the second aromatic ring may each be a substituted or unsubstituted benzene ring. In an embodiment, the first aromatic ring and the second aromatic ring may be fused to form a substituted or unsubstituted naphthalene rings, or a substituted or unsubstituted fluorene ring.

The polymer may further include a second repeating unit that includes a substituted or unsubstituted benzene ring, a substituted or unsubstituted naphthalene ring, a substituted or unsubstituted fluorene ring, or a combination thereof.

The second repeating unit may be selected to allow at least one of the first dihedral angle and second dihedral angle of the polymer to be equal to or greater than $\chi_{50\%}$ obtained from the first repeating unit represented by Formula 1 of the polymer.

When the polymer further includes the second repeating unit, the second repeating unit may be represented by Formula 5A, 5B, 5C, 5D, or 5E.

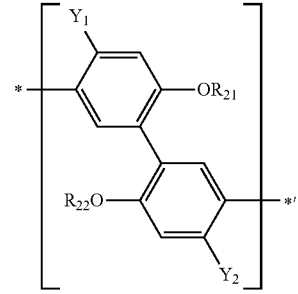

Formula 5A

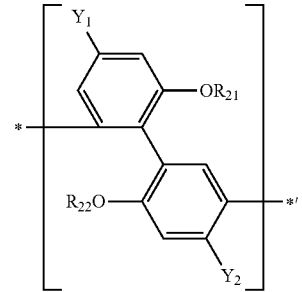

Formula 5B

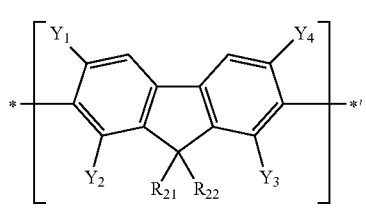

Formula 5C

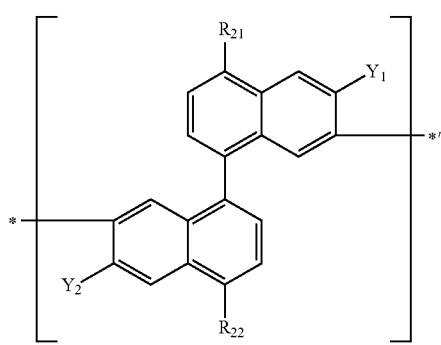

Formula 5D

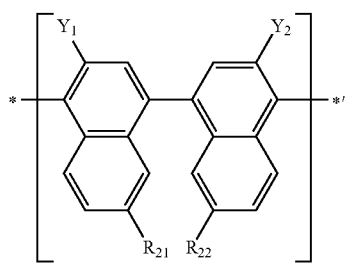

Formula 5E

In Formulae 5A to 5E, $R_{21}$ and $R_{22}$ may be each independently a substituted or unsubstituted $C_1$-$C_{60}$ alkyl group (for example, a substituted or unsubstituted $C_1$-$C_{20}$ alkyl group); $Y_1$ to $Y_4$ may be each independently a hydrogen atom, a substituted or unsubstituted $C_1$-$C_{60}$ alkyl group (for example, a substituted or unsubstituted $C_1$-$C_{20}$ alkyl group), or a substituted or unsubstituted $C_1$-$C_{60}$ alkoxy group (for example, a substituted or unsubstituted $C_1$-$C_{20}$ alkoxy group).

For example, $R_{21}$ and $R_{22}$ may be each independently a methyl group; an ethyl group; a propyl group; an i-propyl group; a butyl group; an i-butyl group; a t-butyl group; a pentyl group; a hexyl group; a heptyl group; an octyl group; a 2-ethylhexyl group; a nonyl group; a decyl group; a 3,7-dimethyloctyl group; or a substituted group that is a methyl group, an ethyl group, a propyl group, an i-propyl group, a butyl group, an i-butyl group, a t-butyl group, a pentyl group, a hexyl group, a heptyl group, an octyl group, a 2-ethylhexyl group, a nonyl group, a decyl group, or a 3,7-dimethyloctyl group, that are each substituted with a deuterium atom, —F, —Cl, a hydroxyl group, a cyano group, a nitro group, a carboxyl group, or a combination thereof, provided that the valence of the group is not exceeded, but are not limited thereto.

For example, $Y_1$ to $Y_4$ may be each independently a hydrogen atom; a methyl group; an ethyl group; a propyl group; an i-propyl group; a butyl group; an i-butyl group; a t-butyl group; a pentyl group; a hexyl group; a heptyl group; an octyl group; a 2-ethylhexyl group; a nonyl group; a decyl group; a 3,7-dimethyloctyl group; a methoxy group; an ethoxy group; a propyloxy group; an i-propyloxy group; a butoxy group; an i-butoxy group; a t-butoxy group; a pentyloxy group; a hexyloxy group; a heptyloxy group; an octyloxy group; a 2-ethylhexyloxy group; a nonyloxy group; a decyloxy group; a 3,7-dimethyloctyloxy group; or a substituted group that is a methyl group, an ethyl group, a propyl group, an i-propyl group, a butyl group, an i-butyl group, a t-butyl group, a pentyl group, a hexyl group, a heptyl group, an octyl group, a 2-ethylhexyl group, a nonyl group, a decyl group, a 3,7-dimethyloctyl group, a methoxy group, an ethoxy group, a propyloxy group, an i-propyloxy group, a butoxy group, an i-butoxy group, a t-butoxy group, a pentyloxy group, a hexyloxy group, a heptyloxy group, an octyloxy group, a 2-ethylhexyloxy group, a nonyloxy group, a decyloxy group, or a 3,7-dimethyloctyloxy group that are each substituted with a deuterium atom, —F, —Cl, a hydroxyl group, a cyano group, a nitro group, a carboxyl group, or a combination thereof, provided that the valence of the group is not exceeded; but are not limited thereto.

The polymer may be a copolymer including the first repeating unit and the second repeating unit. The copolymer may be a block copolymer, a random copolymer, or an alternating copolymer. For example, the copolymer may be an alternating copolymer including the first repeating unit and the second repeating unit.

In an embodiment, the polymer may be an alternating polymer wherein the first and second repeating units form a common repeating unit represented by Formula 6A or 6B.

Formula 6A

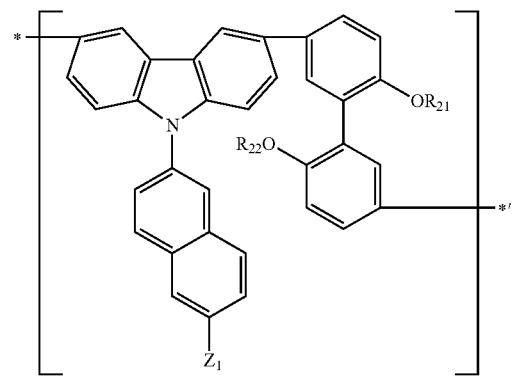

Formula 6B

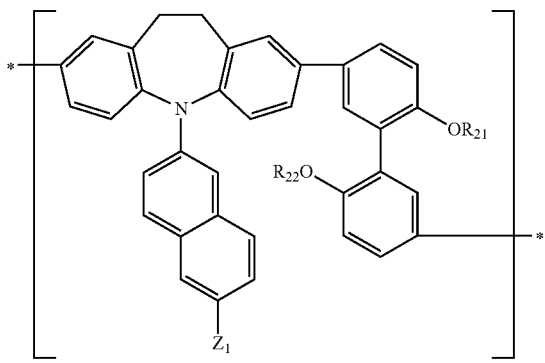

$Z_1$, $R_{21}$, and $R_{22}$ in Formulae 6A and 6B are the same as defined above for $Z_1$ in Formulae 3A to 3l, and $R_{21}$ and $R_{22}$ in Formulae 5A to 5E, so a detailed description thereof will not be recited here.

A weight average molecular weight of the polymer of Formula 1 may be about 2,000 Daltons to about 1,000,000 Daltons, based on polystyrene, and a polydispersity index ("PDI") thereof may be about 1.5 to about 5, but the weight average molecular weight and the PDI of the polymer are not limited thereto. The weight average molecular weight of the polymer of Formula 1 may be about 2,000 Daltons to about 100,000 Daltons, more specifically about 2,000 Daltons to about 50,000 Daltons, based on polystyrene, and the PDI may be about 1.5 to about 4.5, more specifically about 1.7 to about 4.0. The weight average molecular weight and the PDI, which may be measured, for example, by gel permeation chromatography ("GPO") on the basis of polystyrene, may be appropriately determined in consideration of, for example, a structure and desired characteristics of an organic light-emitting device including the polymer.

A number average molecular weight of the polymer of Formula 1 may be about 1,000 Daltons to about 500,000 Daltons, based on polystyrene, but the number average molecular weight is not limited thereto. The number average molecular weight of the polymer of Formula 1 may be about 1,500 Daltons to about 100,000 Daltons, more specifically about 2,000 Daltons to about 25,000 Daltons, based on polystyrene. The number average molecular weight, which may be measured, for example, by gel permeation chromatography ("GPO") on the basis of polystyrene, may be appropriately determined in consideration of, for example, a structure and desired characteristics of an organic light-emitting device including the polymer.

As used herein, the term "substituted X" in the term "substituted or unsubstituted X wherein X is a group refers to a group X substituted with a substituent including a deuterium atom, a halogen atom (specifically the halogens —F, —Cl, —Br, or —I), a hydroxyl group, a nitro group, a cyano group, an amino group (—$NH_2$, —$NH(R_{100})$ or —$N(R_{101})(R_{102})$, wherein $R_{100}$, $R_{101}$, and $R_{102}$ are the same or different, and are each independently a $C_1$ to $C_{10}$ alkyl group), an amidino group, a hydrazino group, a hydrazono group, a carboxylic acid group or a salt derivative thereof, a sulfonic acid group or a salt derivative thereof, a phosphoric acid group or a salt derivative thereof, a carboxyl group, an ester group, a ketone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_3$ to $C_{30}$ alicyclic group, a substituted or unsubstituted $C_6$-$C_{60}$ aryl group, a substituted or unsubstituted $C_6$-$C_{60}$ aryloxy group, a substituted or unsubstituted $C_2$-$C_{60}$ heteroaryl group, a substituted or unsubstituted $C_2$ to $C_{30}$ heterocyclic group, —$N(Q_{101})(Q_{102})$, or —$Si(Q_{103})(Q_{104})(Q_{105})$, wherein $Q_{101}$ to $Q_{105}$ may be each independently a hydrogen atom, a halogen atom (specifically the halogens —F, —Cl, —Br, or —I), a hydroxyl group, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, or a substituted or unsubstituted $C_2$-$C_{60}$ heteroaryl group, a substituted or unsubstituted $C_3$ to $C_{30}$ alicyclic group, a substituted or unsubstituted $C_2$ to $C_{30}$ heterocyclic group, instead of hydrogen of a functional group, or two or more of the forgoing substituents are linked to each other to provide a ring, provided that the substituted atom's normal valence is not exceeded. If the number of substituents is at least 2, the substituents may be identical to or different from each other.

In an embodiment, the "substituted X" may refer to a group X substituted with a substituent including a deuterium atom, a halogen atom (specifically the halogens —F, —Cl, —Br, or —I), a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_6$-$C_{20}$ aryl group, a substituted or unsubstituted $C_2$-$C_{20}$ heteroaryl group, —$N(Q_{101})(Q_{102})$, or —$Si(Q_{103})(Q_{104})(Q_{105})$, wherein $Q_{101}$ to $C_{105}$ may be each independently a hydrogen atom, a halogen atom (specifically the halogens —F, —Cl, —Br, or —I), a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_6$-$C_{20}$ aryl group, or a substituted or unsubstituted $C_2$-$C_{20}$ heteroaryl group, instead of hydrogen of a functional group, provided that the substituted atom's normal valence is not exceeded.

In an embodiment, the "substituted X" may refer to a group X substituted with a substituent including deuterium atom, a halogen atom (specifically the halogens —F, —Cl, —Br, or —I), a hydroxyl group, a cyano group, a $C_1$-$C_{10}$ alkyl group, a $C_1$-$C_{10}$ alkoxy group, a $C_6$-$C_{20}$ aryl group, a $C_2$-$C_{20}$ heteroaryl group, —$N(Q_{101})(Q_{102})$, or —$Si(Q_{103})(Q_{104})(Q_{105})$, wherein $Q_{101}$ to $C_{105}$ may be each independently a hydrogen atom, a halogen atom (specifically the halogens —F, —Cl, —Br, or —I), a hydroxyl group, a cyano group, a $C_1$-$C_{10}$ alkyl group, a $C_1$-$C_{10}$ alkoxy group, a $C_6$-$C_{20}$ aryl group, or a $C_2$-$C_{20}$ heteroaryl group, instead of hydrogen of a functional group, provided that the substituted atom's normal valence is not exceeded.

In an embodiment, the "substituted X" may refer to a group X substituted with a substituent including a deuterium atom, a halogen atom (specifically the halogens —F, —Cl, —Br, or —I), a hydroxyl group, a cyano group, a methyl group, an ethyl group, a propyl group, a butyl group, a pentyl group, a methoxy group, an ethoxy group, a propoxy group, a pentoxy group, a phenyl group, a naphthyl group, or an anthryl group, instead of hydrogen of a functional group, provided that the substituted atom's normal valence is not exceeded.

As used herein, the term "alkyl" group refers to a straight or branched chain saturated aliphatic hydrocarbon having the specified number of carbon atoms, for example a $C_1$ to $C_{60}$ alkyl group, and having a valence of at least one, optionally substituted with one or more substituents where indicated, provided that the valence of the alkyl group is not exceeded. Examples of a $C_1$-$C_{60}$ alkyl group include, but are not limited to, methyl, ethyl, propyl, isobutyl, sec-butyl, pentyl, isoamyl, hexyl, heptyl, octyl, nonyl, and the like. Substituents of a substituted $C_1$-$C_{60}$ alkyl group are the same as described above in conjunction with the "substituted X".

As used herein, the term "alkenyl" group refers to a straight or branched chain hydrocarbon, having at least one carbon-carbon double bond in the center or at a terminal of the group. Non-limiting examples include ethenyl, propenyl, butenyl, pentenyl, hexenyl, heptenyl, octenyl, propadienyl, isoprenyl, and allyl. Substituents of a substituted $C_2$-$C_{60}$ alkenyl group are the same as described above in conjunction with the "substituted X".

As used herein, the "alkynyl" group refers to a straight or branched chain hydrocarbon that comprises at least one carbon-carbon triple bond, having the specified number of carbon atoms, for example a $C_2$ to $C_{80}$ alkynyl group, and having a valence of at least one, optionally substituted with one or more substituents where indicated, provided that the valence of the alkynyl group is not exceeded. Non-limiting examples include of an unsubstituted $C_2$-$C_{60}$ alkynyl group is acetylenyl. Substituents of a substituted $C_2$-$C_{60}$ alkynyl group are the same as described above in conjunction with the "substituted X".

The term "alkylene" group refers to a straight or branched chain, saturated, aliphatic hydrocarbon group having the specified number of carbon atoms, for example a $C_1$ to $C_{30}$ alkylene group, and specifically a $C_1$ to $C_{1-8}$ alkylene group, and having a valence of at least two, optionally substituted with one or more substituents where indicated, provided that the valence of the alkyl group is not exceeded. Substituents of a substituted $C_1$ to $C_{30}$ alkylene group are the same as described above in conjunction with the "substituted X".

The term "alkenylene" group refers to a straight or branched chain hydrocarbon group having at least one carbon-carbon double bond and having a valence of at least two, optionally substituted with one or more substituents where indicated, provided that the valence of the alkyl group is not exceeded. Substituents are the same as described above in conjunction with the "substituted X".

The term "alkynylene" group refers to a straight or branched chain divalent aliphatic hydrocarbon that has one or more unsaturated carbon-carbon bonds, at least one of which is a triple bond optionally substituted with one or more substituents where indicated, provided that the valence of the alkyl group is not exceeded. Substituents are the same as described above in conjunction with the "substituted X". Non-limiting examples include ethynylene.

As used herein, the term "alkoxy" group refers to an alkyl group as defined above, linked via an oxygen, e.g., —O-alkyl, having the specified number of carbon atoms, for example a $C_1$ to $C_{60}$ alkoxy group. Examples of an unsubstituted $C_1$-$C_{60}$ alkoxy group include a methoxy group, an ethoxy group, an isopropyloxy group, a butoxy group, and a pentoxy group. Substituents of a substituted $C_1$-$C_{60}$ alkoxy group are the same as described above in conjunction with the "substituted X".

As used herein, the term "cycloalkyl" group refers to a group that comprises one or more saturated and/or partially saturated rings in which all ring members are carbon, such as Non-limiting examples of an unsubstituted $C_3$-$C_{60}$ cycloalkyl group include cyclopropyl, cyclobutyl, cyclopentyl, cyclohexyl, cycloheptyl, cyclooctyl, adamantyl and partially saturated variants of the foregoing, such as cycloalkenyl groups (e.g., cyclohexenyl) or cycloalkynyl groups, and having a valence of at least one, and optionally substituted with one or more substituents where indicated, provided that the valence of the cycloalkyl group is not exceeded. Cycloalkyl groups do not include an aromatic ring or a heterocyclic ring. When the numbers of carbon atoms is specified, for example a $C_3$ to $C_{30}$ cycloalkyl group, the number means the number of ring members present in the one or more rings. Substituents of a substituted $C_3$-$C_{60}$ cycloalkyl group are the same as described above in conjunction with the "substituted X".

As used herein, the term "cycloalkenyl" group refers to a stable monovalent aliphatic monocyclic or polycyclic group having at least one carbon-carbon double bond, wherein all ring members are carbon, optionally substituted with one or more substituents where indicated, provided that the valence of the cycloalkenyl group is not exceeded. Examples of an unsubstituted $C_3$-$C_{60}$ cycloalkenyl group include cyclopropenyl, cyclobutenyl, cyclopentenyl, cyclohexenyl, cycloheptenyl, 1,3-cyclohexadienyl, 1,4-cyclohexadienyl, 2,4-cycloheptadienyl, and 1,5-cyclooctadienyl. Substituents of a substituted $C_3$-$C_{60}$ cycloalkenyl group are the same as described above in conjunction with the "substituted X".

The term "cycloalkynyl" group refers to a stable aliphatic monocyclic or polycyclic group having at least one carbon-carbon triple bond, wherein all ring members are carbon, optionally substituted with one or more substituents where indicated, provided that the valence of the cycloalkynyl group is not exceeded. Non-limiting examples include cyclohexynyl. Substituents are the same as described above in conjunction with the "substituted X".

The term "cycloalkylene" group refers to a divalent radical formed by the removal of two hydrogen atoms from one or more rings of a cycloalkyl group, as defined above.

The term "cycloalkenylene" group refers to a stable aliphatic 5-15-membered monocyclic or polycyclic, divalent radical having at least one carbon-carbon double bond, which comprises one or more rings connected or bridged together. Unless mentioned otherwise, the cycloalkenylene radical can be linked at any desired carbon atom provided that a stable structure is obtained. If the cycloalkenylene radical is substituted, this may be so at any desired carbon atom, once again provided that a stable structure is obtained. Substituents are the same as described above in conjunction with the "substituted X". Non-limiting examples thereof include cyclopentenylene, cyclohexenylene, cycloheptenylene, cyclooctenylene, cyclononenylene, cyclodecenylene, norbornenylene, 2-methylcyclopentenylene, 2-methylcyclooctenylene, and the like.

The term "cycloalkynylene" group refers to a stable aliphatic 8- to 15-membered monocyclic or polycyclic divalent radical having at least one carbon-carbon triple bond and consisting solely of carbon and hydrogen atoms which may comprise one or more fused or bridged ring(s), preferably a 8- to 10-membered monocyclic or 12- to 15-membered bicyclic ring. Unless otherwise specified, the cycloalkynylene ring may be attached at any carbon atom which results in a stable structure and, if substituted, may be substituted at any carbon atom that results in a stable structure. Substituents are the same as described above in conjunction with the "substituted X". Non-limiting examples include cyclooctynylene, cyclononynylene, cyclodecynylene, 2-methylcyclooctynylene, and the like.

Throughout this disclosure, reference is made to various heterocyclic groups. Within such groups, the term "hetero" means a group that comprises at least one ring member that is a heteroatom (e.g., 1 to 4 heteroatoms, each independently N, O, S, P, or Si). In each instance, the total number of ring members may be indicated (e.g., a 3- to 10-membered heterocycloalkyl). If multiple rings are present, each ring is independently aromatic, saturated or partially unsaturated and multiple rings, if present, may be fused, pendant, spirocyclic or a combination thereof. A "heterocycloalkyl" group comprises at least one non-aromatic ring that contains a heteroatom ring member, optionally substituted with one or more substituents where indicated, provided that the valence of the heterocycloalkyl group is not exceeded. Substituents are the same as described above in conjunction with the "substituted X".

A "heteroalkyl" group is an alkyl group as defined above, that comprises at least one heteroatom covalently bonded to one or more carbon atoms of the alkyl group. Each heteroatom is independently chosen from N, O, S, Si, or P.

As used herein, the term "aryl" group refers to a cyclic group in which all ring members are carbon and at least one ring is aromatic, the group having the specified number of carbon atoms, for example a $C_6$ to $C_{60}$ aryl group, and having a valence of at least one, optionally substituted with one or more substituents where indicated, provided that the valence of the aryl group is not exceeded. More than one ring may be present, and any additional rings may be independently aromatic, saturated or partially unsaturated, and may be fused, pendant, spirocyclic, or a combination thereof. Examples include phenyl, pentalenyl, indenyl, naphthyl, azulenyl, heptalenyl, indacenyl, acenaphthyl, fluorenyl, spiro-fluorenyl, phenalenyl, phenanthryl, anthryl, fluoranthenyl, triphenylenyl, pyrenyl, chrysenyl, naphthacenyl, picenyl, perylenyl, pentaphenyl, and hexacenyl. Substituents are the same as described above in conjunction with the "substituted X".

The term "aryloxy" group refers to an aryl group as defined above, having the specified number of carbon atoms, for example a $C_6$ to $C_{30}$ aryloxy group, and specifically a $C_6$ to $C_{18}$ aryloxy group, linked via an oxygen, e.g., aryl-O—.

The term "arylthio" group refers to an aryl group as defined above, linked via a sulfur, e.g., aryl-S—.

The term "arylene" group refers to a divalent radical formed by the removal of two hydrogen atoms from one or more rings of an aromatic hydrocarbon, wherein the hydrogen atoms may be removed from the same or different rings, each of which rings may be aromatic or nonaromatic, and having the specified number of carbon atoms, for example a $C_6$ to $C_{30}$ arylene group, and specifically a $C_6$ to $C_{16}$ arylene group, optionally substituted with one or more substituents where indicated, provided that the valence of the arylene group is not exceeded. Substituents are the same as described above in conjunction with the "substituted X".

As used herein, a "heteroaryl" group refers to a monovalent carbocyclic ring group that includes one or more aromatic rings, in which at least one ring member (e.g., one, two or three ring members) is a heteroatom, optionally substituted with one or more substituents where indicated, provided that the valence of the heteroaryl group is not exceeded. In a $C_3$ to $C_{30}$ heteroaryl, the total number of ring carbon atoms ranges from 3 to 30, with remaining ring atoms being heteroatoms. Multiple rings, if present, may be pendent, spiro or fused. The heteroatom(s) are independently chosen from N, O, S, Si, or P. Examples include pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzooxazolyl, benzoimidazolyl, furanyl, benzofuranyl, thiophenyl, benzothiophenyl, thiazolyl, isothiazolyl, benzothiazolyl, isoxazolyl, oxazolyl, triazolyl, tetrazolyl, oxadiazolyl, triazinyl, and benzooxazolyl. Substituents of a substituted $C_3$-$C_{60}$ heteroaryl group are the same as described above in conjunction with the "substituted X".

A "heteroarylene" group refers to a divalent radical formed by the removal of two hydrogen atoms from one or more rings of a heteroaryl moiety, as defined above, wherein the hydrogen atoms may be removed from the same or different rings (preferably the same ring), each of which rings may be aromatic or nonaromatic.

A "heteroaryloxy" group refers to a heteroaryl group as defined above, linked via an oxygen, e.g., heteroaryl-O—.

A "heteroarylthio" group refers to a heteroaryl group as defined above, linked via a sulfur, e.g., heteroaryl-S—.

The term "ester" group refers to a —C(=O)OR group, or —OC(=O)R group wherein R is an aliphatic group as defined below, having the specified number of carbon atoms, for example a $C_2$ to $C_{30}$ ester group, and specifically a $C_2$ to $C_{18}$ ester group, wherein the carbon of the carbonyl group is included in the specified number of carbon atoms.

The term "ketone" group refers to a —C(=O)R group, wherein R is an aliphatic group as defined below, having the specified number of carbon atoms, for example a $C_2$ to $C_{30}$ ketone group, and specifically a $C_2$ to $C_{18}$ ketone group, wherein the carbon of the carbonyl group is included in the specified number of carbon atoms.

The term "(meth)acrylate" refers to an acrylate group ($H_2C=CH—C(=O)O—$) and a methacrylate group ($H_2C=C(CH_3)—C(=O)—$), and (meth)acryloxy refers to an acryloxy group and a methacryloxy group.

As used herein, when a specific definition is not otherwise provided, the term "aliphatic group" refers to a $C_1$ to $C_{30}$ alkyl group, a $C_2$ to $C_{30}$ alkenyl group, a $C_2$ to $C_{30}$ alkynyl group, a $C_1$ to $C_{30}$ alkylene group, a $C_2$ to $C_{30}$ alkenylene group, or a $C_2$ to $C_{30}$ alkynylene group, and specifically a $C_1$ to $C_{15}$ alkyl group, a $C_2$ to $C_{15}$ alkenyl group, a $C_2$ to $C_{15}$ alkynyl group, a $C_1$ to $C_{15}$ alkylene group, a $C_2$ to $C_{15}$ alkenylene group, or $C_2$ to $C_{15}$ alkynylene group.

The term "alicyclic group" refers to a $C_3$ to $C_{30}$ cycloalkyl group, a $C_3$ to $C_{30}$ cycloalkenyl group, a $C_3$ to $C_{30}$ cycloalkynyl group, a $C_3$ to $C_{30}$ cycloalkylene group, a $C_3$ to $C_{30}$ cycloalkenylene group, or $C_3$ to $C_{30}$ cycloalkynylene group, and specifically a $C_3$ to $C_{15}$ cycloalkyl group, a $C_3$ to $C_{15}$ cycloalkenyl group, a $C_3$ to $C_{15}$ cycloalkynyl group, a $C_3$ to $C_{15}$ cycloalkylene group, a $C_3$ to $C_{15}$ cycloalkenylene group, or $C_3$ to $C_{15}$ cycloalkynylene group.

The term "aromatic group" refers to a $C_6$ to $C_{30}$ aryl group or $C_6$ to $C_{30}$ arylene group, and specifically a $C_6$ to $C_{16}$ aryl group or $C_6$ to $C_{16}$ arylene group.

The term "heterocyclic group" refers to a $C_2$ to $C_{30}$ heterocycloalkyl group, a $C_2$ to $C_{30}$ heterocycloalkylene group, a $C_2$ to $C_{30}$ heterocycloalkenyl group, a $C_2$ to $C_{30}$ heterocycloalkenylene group, a $C_2$ to $C_{30}$ heterocycloalkynyl group, a $C_2$ to $C_{30}$ heterocycloalkynylene group, a $C_2$ to $C_{30}$ heteroaryl group, or $C_2$ to $C_{30}$ heteroarylene group that include 1 to 3 heteroatoms selected from O, S, N, P, Si, and a combination thereof in one ring, and specifically a $C_2$ to $C_{15}$ heterocycloalkyl group, a $C_2$ to $C_{15}$ heterocycloalkylene group, a $C_2$ to $C_{15}$ heterocycloalkenyl group, a $C_2$ to $C_{15}$ heterocycloalkenylene group, a $C_2$ to $C_{15}$ heterocycloalkynyl group, a $C_2$ to $C_{15}$ heterocycloalkynylene group, a $C_2$ to $C_{15}$ heteroaryl group, or a $C_2$ to $C_{15}$ heteroarylene group, wherein the foregoing heterocyclic groups each include 1 to 3 heteroatoms selected from O, S, N, P, Si, and a combination thereof in one ring. Other heteroatoms may also be present.

The term "aromatic condensed ring" refers to an aromatic group having two or more rings, wherein at least two of the rings are fused, i.e., share at least two carbon atoms.

The term "condensed cyclic group" refers to a group having two or more rings, wherein at least two of the rings are fused, i.e., share at least two carbon atoms.

The term "combination thereof" refers to a combination comprising at least one of the named constituents, components, compounds, or elements, optionally together with one or more of the same class of constituents, components, compounds, or elements not named.

As used herein, the mark "*" and "*'" indicate binding sites with neighboring moieties, e.g., a point of attachment to a repeating unit.

The polymer including the first repeating unit of Formula 1 may be synthesized using a known organic synthesis method, for example, using Suzuki coupling or Yamamoto coupling. A synthesis method of the polymer may be any known method used for synthesizing a polymer and may be further described from the examples below.

Thus, the polymer may be used in an organic light-emitting device, for example, as a phosphorescent host in an emission layer of an organic light-emitting device which may further include a phosphorescent dopant.

Compared to a fluorescent material with a 25% internal quantum efficiency at maximum, in which only a singlet state energy level contributes to light emission, a phosphorescent material that enables intersystem crossing between singlet and triplet state energy levels may theoretically have a 100% internal quantum efficiency at maximum since excitons having a triplet state energy level also contribute to light emission. Therefore, while not wanting to be bound by theory, it is believed an organic light-emission device including a phosphorescent material has high efficiency. If a high triplet state energy level of a known phosphorescent dopant and the above-described characteristics of the polymer are taken into consideration, the polymer may be used as a phosphorescent host in an emission layer of an organic light-emitting device.

In an embodiment, the polymer may be used as a red, green, and/or blue phosphorescent host in an emission layer of an organic light-emitting device. In an embodiment, the polymer may be used as a red and/or green phosphorescent host in an emission layer of an organic light-emitting device, but is not limited thereto.

According to another exemplary embodiment of the present disclosure, an organic light-emitting device ("OLED") includes a substrate, a first electrode disposed on the substrate, a second electrode, and a first layer disposed between the first electrode and the second electrode, the first layer including the above-described polymer.

The first layer may function as, for example, an emission layer.

If the first layer is an emission layer, the first layer may further include a phosphorescent dopant. The phosphorescent dopant included in the first layer may be any known phosphorescent dopant. For example, the phosphorescent dopant may include an organometallic complex including iridium (Ir), platinum (Pt), osmium (Os), rhenium (Re), titanium (Ti), zirconium (Zr), hafnium (Hf), or a combination thereof.

For example, the phosphorescent dopant may include bisthienylpyridine acetylacetonate iridium, bis(benzothienylpyridine)acetylacetonate iridium, bis(2-phenylbenzothiazole)acetylacetonate iridium, bis(1-phenylisoquinoline) iridium acetylacetonate, tris(1-phenylisoquinoline) iridium, tris(phenylpyridine) iridium, tris(2-biphenylpyridine) iridium, tris(3-biphenyl pyridine) iridium, tris(4-biphenyl pyridine) iridium, Ir(pq)$_2$(acac) (wherein "pq" is an abbreviation for 2-phenylquinoline; and "acac" is an abbreviation for acetylacetone, as represented by Compound 10 below), Ir(ppy)$_3$ (wherein "ppy" is an abbreviation for phenylpyridine, as represented by Compound II below), platinum(II)octaethylporphyrin ("PtOEP", as represented by the formula below), Compound 12 below, bis(4,6-difluorophenylpyridinato-N,C2)picolinatoiridium ("Firpic", as represented by Compound 13 below), tris[1-phenylisoquinolinato-C2,M]iridium(III) ("Ir(piq)$_3$", as represented by the formula below), Ir(piq)$_2$acac (wherein "piq" is an abbreviation for phenylisoquinoline, as represented by Compound 14 below), Iridium (III)tris(2-(4-toyl)pyridanoto-N,C2 ("Ir(mppy)$_3$", as represented by Dopant 1 below), Dopant 2 below, Btp$_2$Ir(acac) as represented by the formula below, bis[2-(4,6-difluorophenyl)pyridinato-N,C2]iridium picolinate ("F$_2$Irpic", as represented by the formula below), (F$_2$ppy)$_2$Ir(tmd) as represented by the formula below, tris[1-(4,6-difluorophenyl)pyrazolate-N,C2']iridium (("Ir(dfppz)$_3$") as represented by the formula below), or a combination thereof, but is not limited thereto.

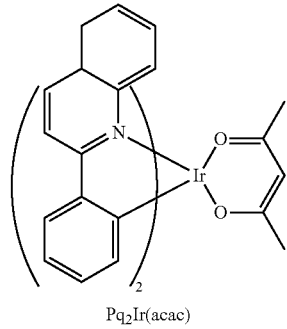

Compound 10

Pq$_2$Ir(acac)

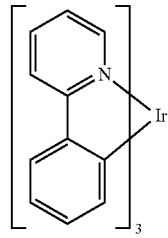

Compound 11

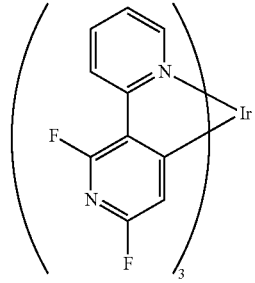

Compound 12

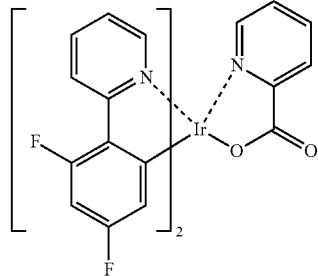

Compound 13

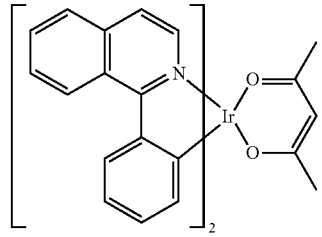

Compound 14

Dopant 1

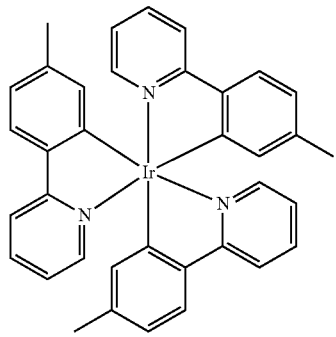

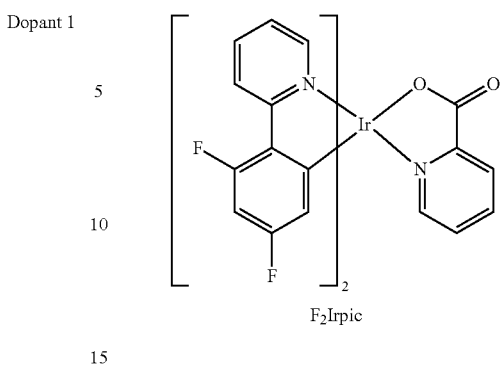
F₂Irpic

Dopant 2

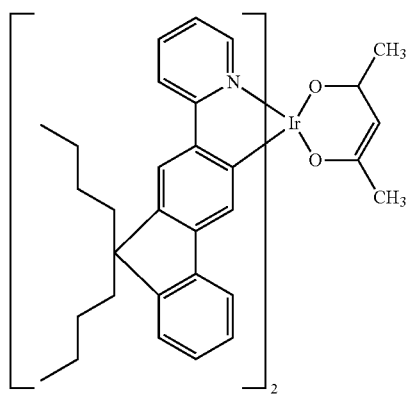

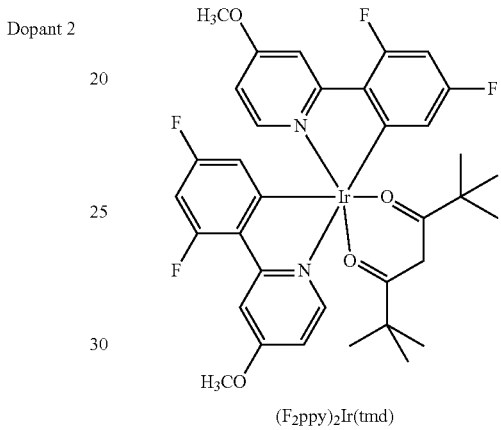
(F₂ppy)₂Ir(tmd)

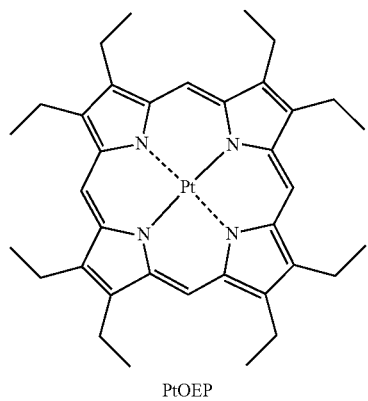
PtOEP

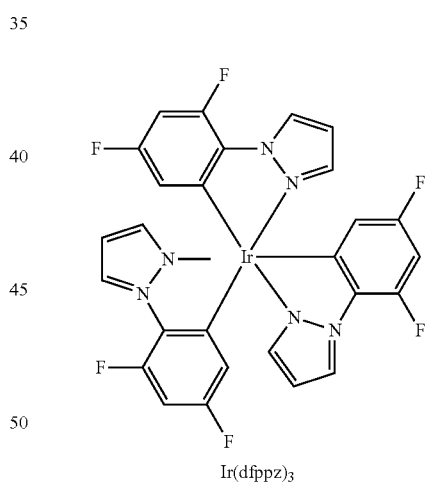
Ir(dfppz)₃

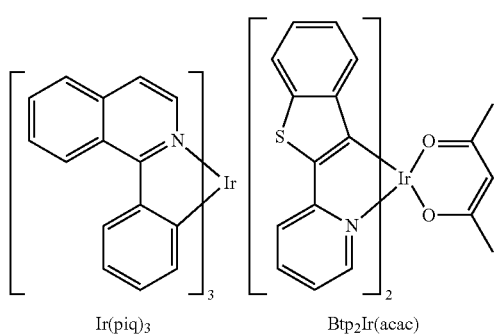
Ir(piq)₃        Btp₂Ir(acac)

In addition to the first layer that may function as an emission layer, as described above, the OLED may further include a hole injection layer ("HIL"), a hole transport layer ("HTL"), a hole blocking layer ("HBL"), an electron transport layer ("ETL"), an electron injection layer ("EL"), or a combination thereof sequentially disposed between the first electrode and the second electrode of the OLED.

FIG. 1 is a schematic sectional view of an OLED 10 according to an embodiment. Referring to FIG. 1, the OLED 10 includes a substrate 11, a first electrode 12 disposed on the substrate, an HTL 13, a first layer 15, an ETL 16, and an EIL 18 sequentially disposed between the first electrode 12 and a second electrode 19. The first layer 15 may function as an emission layer ("EML"). Hereinafter, the OLED 10 and a method of manufacturing the same will be described in further detail.

The first electrode 12 is disposed on the substrate 11 by deposition, ion plating, plating, sputtering, or the like. The first electrode 12 may include a first electrode-forming material having a high work function. The first electrode 12 may be an anode through which holes are injected or a cathode through which electrons are injected. The substrate 11, which may be any substrate that is used in general OLEDs, and may be a glass substrate or a transparent plastic substrate with excellent or improved mechanical strength, thermal stability, transparency, surface smoothness, ease of handling, and water resistance. Examples of the first electrode-forming material include a metal oxide, a metal sulfide, or a metal, each of which has a high electrical conductivity. In general, these materials are used to form a thin film. Examples of the first electrode-forming material include a metal oxide such as indium oxide, zinc oxide, tin oxide, indium tin oxide ("ITO"), indium zinc oxide ("IZO"), gold ("Au"), platinum ("Pt"), silver ("Ag"), copper ("Cu"), or a combination thereof. A polyaniline or a derivative thereof, or polythiophene or a derivative thereof, or a combination thereof may also be used as the first electrode-forming material. The first electrode 12 may have a mono-layered (e.g. single-layered) structure or a multi-layered structure including two or more layers. The first electrode 12 may contain two or more different materials. A thickness of the first electrode 12 may be effectively controlled depending on light transmittance and electrical conductivity, for example, and may be in the range of about 10 nanometers (nm) to about 10 micrometers (μm), specifically about 100 nm to about 5 μm, more specifically about 500 nm to about 2 μm.

Although not illustrated in FIG. 1, if the first electrode 12 is an anode, a HIL may be further disposed on the first electrode 12. The HIL may be disposed by vacuum deposition, spin coating, casting, inkjet printing, Langmuir-Blodgett ("LB") deposition, or the like.

When the HIL is disposed by vacuum deposition, the deposition conditions may vary according to a material that is used to form the HIL, and the structure and thermal properties of the HIL. For example, conditions for vacuum deposition may include a deposition temperature of 100 to 500° C., specifically about 150 to about 450° C., more specifically about 200 to about 400° C., a vacuum pressure of about $10^{-8}$ to about $10^{-3}$ torr, specifically about $10^{-7}$ to about $10^{-4}$ torr, more specifically about $10^{-6}$ to about $10^{-5}$ torr, and a deposition rate of about 0.01 to about 100 angstroms per second ("Å/sec"), specifically about 0.05 to about 75 Å/sec, more specifically about 0.10 to about 50 Å/sec.

When the HIL is disposed by spin coating, the coating conditions may vary according to a material that is used to form the HIL, and the structure and thermal properties of the HIL. For example, conditions for spin coating may include a coating rate of about 2000 to about 5000 revolutions per minute ("rpm"), specifically about 2250 to about 4750 rpm, more specifically about 2500 to about 4500 rpm, and a heat treatment temperature of about 80 to 300° C., specifically about 90 to 250° C., more specifically about 100 to 200° C., to facilitate removing a solvent after coating.

The HIL may include any known material that is used to form an HIL. Examples of the material that may be used to form the HIL include a phthalocyanine compound such as copper phthalocyanine, 4,4',4"-tris (3-methylphenylphenylamino) triphenylamine ("m-MTDATA"), N,N'-di(1-naphthyl)-N,N'-diphenylbenzidine ("NPB"), TDATA represented by the formula below, 2T-NATA represented by the formula below, or a combination thereof, but are not limited thereto.

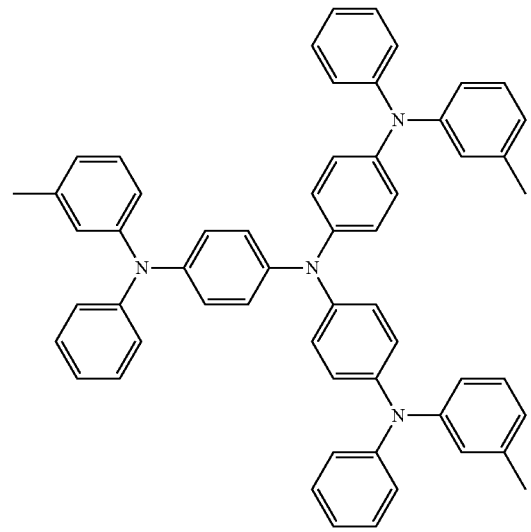

m-MTDATA

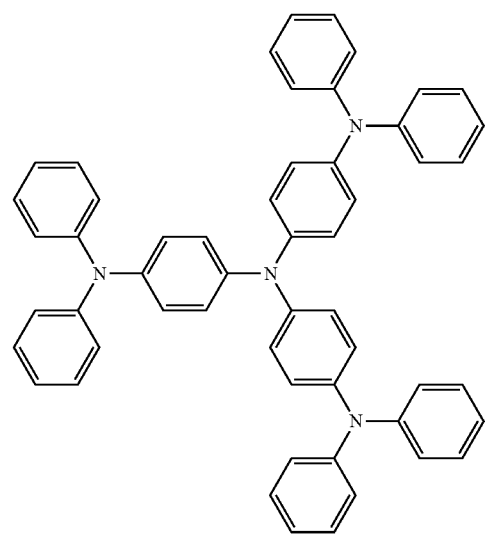

TDATA

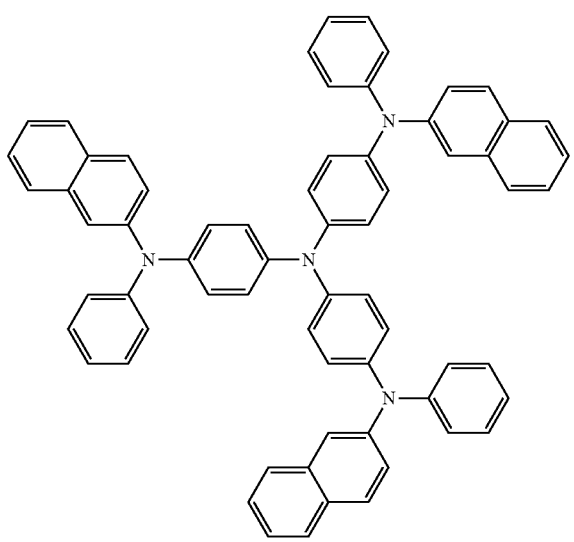

2T-NATA

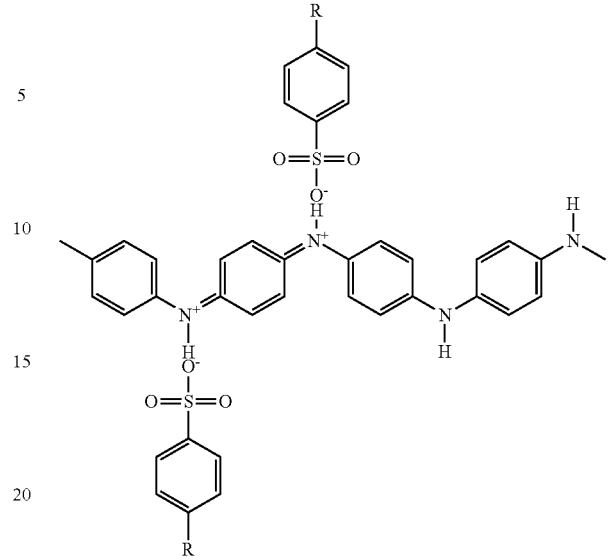

Pani/DBSA

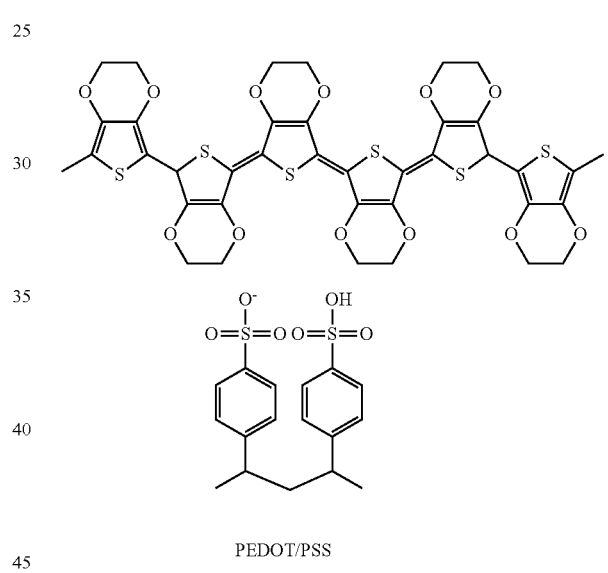

PEDOT/PSS

The thickness of the HIL may be about 100 angstroms (Å) to about 10,000 Å, and in some other embodiment, may be about 100 Å to about 5,000 Å, and more specifically about 100 Å to about 1,000 Å. When the thickness of the HIL is within these ranges, the HIL may have satisfactory hole injection properties without an increase or with a reduced increase in a driving voltage.

The HTL 13 may be disposed on the first electrode 12 or the HIL by vacuum deposition, spin coating, casting, inkjet printing, LB deposition, or the like.

When the HTL 13 is disposed by vacuum deposition or spin coating, the conditions for deposition and coating may be similar to those applied to dispose the HIL, although the conditions for the deposition and coating may vary according to the material that is used to form the HTL 13.

The HTL 13 may include any known material used to form an HTL. Examples of the material that may be used to form the HTL 13 include an amine derivative including an aromatic condensed ring, such as N,N'-bis(3-methylphenyl)-N,N'-diphenyl-[1,1-biphenyl]-4,4'-diamine ("TPD", represented by the formula below), polyaniline/dodecylbenzenesulfonic acid (Pani/DBSA", represented by the formula below); poly (3,4-ethylenedioxythiophene)/poly(4-styrenesulfonate) ("PEDOT/PSS", represented by the formula below); polyaniline/camphor sulfonic acid ("Pani/CSA"); polyaniline/poly (4-styrenesulfonate ("PANI/PSS"), or a combination thereof, but are not limited thereto.

A thickness of the HTL 13 may be about 50 Å to about 1,000 Å, and in an embodiment, may be about 75 Å to about 800 Å, and more specifically about 100 A to about 600 Å. When the thickness of the HTL 13 is within these ranges, the HTL 13 may have satisfactory hole transport properties without an increase in or with a reduced increase in a driving voltage.

The first layer 15, which may function as an emission layer, may be disposed on the HTL 13. The first layer 15 may be disposed by spin coating, casting, inkjet printing, LB deposition, or the like. When the first layer 15 is disposed by spin coating, the coating conditions may be similar to those applied to dispose the HIL 13, although the coating conditions may vary according to a polymer and/or a compound that is used to form the first layer 15.

The first layer 15 may include the polymer including the repeating unit represented by Formula 1 as a phosphorescent host. In an embodiment, the first layer 15 may further include a phosphorescent dopant, in addition to the above-described polymer. Examples of the phosphorescent dopant are described above.

If the first layer 15 includes the above-described polymer and a phosphorescent dopant, the amount of the phosphorescent dopant in the first layer 15 may be about 0.5 weight percent ("wt %") to about 10 wt % based on a total weight of the first layer 15, specifically about 2 wt % to about 9 wt %, more specifically about 3 wt % to about 8 wt %, based on a total weight of the first layer 15. When the amount of the phosphorescent dopant is within this range, concentration quenching may be prevented or reduced.

In some other embodiment, the first layer 15 may only include the above-described polymer including the repeating unit represented by Formula 1. Alternatively, the first layer 15 may include the above-described polymer including the repeating unit represented by Formula 1, and further include a known fluorescent dopant. However, the first layer 15 is not limited thereto.

A thickness of the first layer 15, which may function as an EML, may be about 100 Å to about 1,000 Å, and in an embodiment, may be about 200 Å to about 900 Å more specifically about 300 Å to about 800 Å. When the thickness of the first layer 15 is within these ranges, the first layer 15 may have satisfactory light emission characteristics without an increase in or with a reduced increase in a driving voltage.

An HBL may be disposed on the first layer 15, although not illustrated in FIG. 1.

The HBL may prevent or reduce diffusion of triplet excitons or holes in the first layer 15 to the second electrode 19. The HBL may be disposed by vacuum deposition, spin coating, casting, LB deposition, or the like. When the HBL is disposed by vacuum deposition or spin coating, the deposition and coating conditions may be similar to those applied to dispose the HIL, although the conditions for deposition and coating may vary according to the material that is used to form the HBL. Examples of the material that may be used to form the HBL include an oxadiazole-containing compound, such as 2-(4-biphenyl)-5-(4-tert-butylphenyl)-1,3,4-oxadiazole ("PBD"), a triazole-containing compound, such as TAZ, as represented by the formula below, a phenanthroline-containing compound such as 2,9-dimethyl-4,7-diphenyl-1,10-phenanthroline ("BCP"), 4,7-diphenyl-1,10-phenanthroline ("Bphen"), or the like, benzazole-containing compound such as 2,2',2''-(1,3,5-phenylene)tris[1-phenyl-1H-benzimidazole] ("TPBi"), fluorinated phenylene, 1,8-naphthalimide, polyquinoline, or a combination thereof, but are not limited thereto.

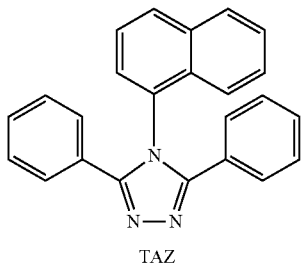

TAZ

The thickness of the HBL may be about 50 Å to about 1,000 Å, and in an embodiment, may be about 75 Å to about 600 Å, and more specifically about 100 Å to about 300 Å. When the thickness of the HBL is within these ranges, the HBL may have satisfactory hole blocking properties.

The ETL 16 may be disposed on the first layer 15 or HBL by vacuum deposition, spin coating, casting, or the like. When the ETL 16 is disposed by vacuum deposition or spin coating, the deposition and coating conditions may be similar to those applied to dispose the HIL, although the deposition and coating conditions may vary according to the material that is used to form the ETL. Examples of the material that may be used to form the ETL 16 include any known material that stably transports electrons injected through an electron injection electrode, such as a cathode, include a quinolone-containing compound, a phenanthroline-containing compound such as 2,9-dimethyl-4,7-diphenyl-1,10-phenanthroline ("BCP"), 4,7-diphenyl-1,10-phenanthroline ("Bphen"), or the like, BAlq, as represented by the formula below, tris(8-quinolinorate)aluminum ("$Alq_3$"), beryllium bis(benzoquinolin-10-olate ("$Bebq_2$"), a benzazole-containing compound such as TPBi as represented by the formula below, or a combination thereof, but are not limited thereto.

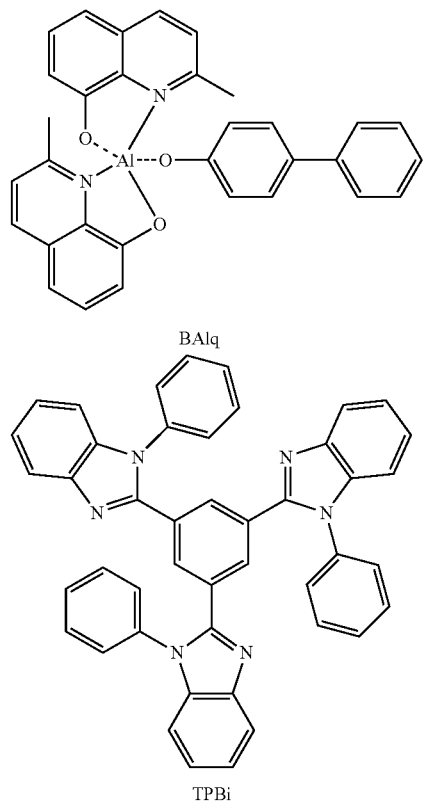

BAlq

TPBi

The thickness of the ETL 16 may be about 100 Å to about 1,000 Å, and in some an embodiment, may be about 150 Å to about 800 Å, and more specifically about 200 Å to about 500 Å. When the thickness of the ETL 16 is within these ranges, the ETL 16 may have satisfactory electron transport properties without an increase in or with a reduced increase in a driving voltage.

The EIL 18 may be disposed on the ETL 16 or the first layer 15. The EIL 18 may include any known material used to form an EIL, such as LiF, NaCl, CsF, $Li_2O$, BaO, $BaF_2$, or the like. The deposition and coating conditions for disposing the EIL 18 may be similar to those applied to dispose the HIL, although the deposition and coating conditions may vary according to the material that is used to form the EIL 18.

A thickness of the EIL 18 may be about 1 Å to about 100 Å, and in an embodiment, may be about 2 Å to about 75 Å, more specifically about 5 Å to about 50 Å. When the thickness of the EIL 18 is within these ranges, the EIL 18 may have satisfactory electron injection properties without an increase in or with a reduced increase in a driving voltage.

The second electrode 19 may be disposed on the EIL 19. The second electrode 19 may be disposed according to the method described above for disposing the first electrode 12. The second electrode 19 may be a cathode or an anode. When the second electrode 19 is a cathode, the second electrode 19 may include a material having a low work function. Examples of the material having a low work function include an alkali metal, such as lithium (Li), sodium (Na), potassium (K), rubidium (Rb), or cesium (Cs); an alkali earth metal, such as beryllium (Be), magnesium (Mg), calcium (Ca), strontium (Sr), or barium (Ba); a metal, such as aluminum (Al), scandium (Sc), vanadium (V), zinc (Zn), yttrium (Y), indium (In), cerium (Ce), samarium (Sm), europium (Eu), terbium (Tb), or ytterbium (Yb); an alloy of two or more of the foregoing metals; an alloy of at least one of the foregoing metals combined with gold (Au), silver (Ag), platinum (Pt), copper (Cu), manganese (Mg), titanium (Ti), cobalt (Co), nickel (Ni), tungsten (W), tin (Sn), or a combination thereof; graphite; a graphite intercalation compound, or a combination thereof, but are not limited thereto. Examples of alloys that may be used to form the second electrode 19 include a Mg—Ag alloy, a Mg—In alloy, a Mg—Al alloy, an In—Ag alloy, a Li—Al alloy, a Li—Mg alloy, a Li—In alloy, a Ca—Al alloy, or a combination thereof. The second electrode 19 may have a mono-layer (e.g., a single layer) structure or a multi-layer structure including two or more layers. The second electrode 19 may only include one material or may include two or more different materials. The second electrode 19 may be any known electrode for use in an OLED, for example, a transparent, semitransparent, or reflective electrode, but is not limited thereto. A thickness of the second electrode 19 may be about 10 nm to about 10 μm, specifically about 50 nm to about 5 μm, more specifically about 100 nm to about 1 μm, but is not limited thereto.

Hereinafter, the embodiments of this present disclosure will be described in further detail with reference to the following examples. However, these examples are exemplary embodiments and are not limiting of the claims.

EXAMPLES

Synthesis Example 1

Synthesis of Polymer A

Polymer A: Polymer Including the Following Common Repeating Unit

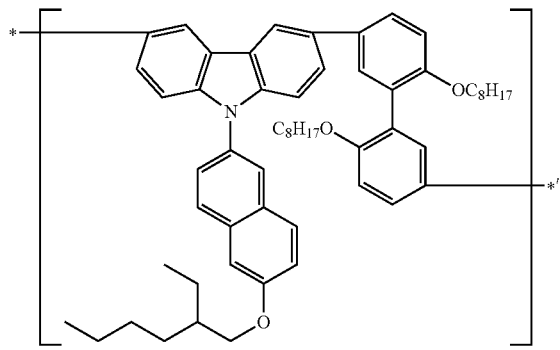

After equipping a 50 milliliter (mL), well-dried 2-necked flask with a reflux condenser, 668 milligrams (mg) (1.0 millimoles (mmol)) of Compound B below, 568 mg (1.0 mmol) of Compound C below, 4.49 mg (0.02 mmol) of palladium(II) acetate (Pd(OAc)$_2$), and 22.4 mg (0.08 mmol) of tricyclohexylphosphine ("PCy$_3$") were put into the flask, which was then connected to a Schlenk line, followed by evacuation several times, and refluxing under a nitrogen atmosphere. Subsequently, after addition of 6 mL of anhydrous toluene in a nitrogen atmosphere by stirring, 45.7 microliters (pL) (0.1 mmol) of Aliquat 336 and 4 mL of a 2 Molar (M) aqueous potassium carbonate solution were added thereto. The reaction mixture was stirred under reflux conditions and a nitrogen atmosphere for about 48 hours. After addition of 340 mg (2.5 mmol) of p-tolyl boronic acid and stirring for 1 hour, 308 μL (2.5 mmol) of 4-bromotoluene was added and further stirred for 2 hours. After completion of the reaction, the temperature of the reaction mixture was decreased to room temperature, diluted by addition of 30 mL of toluene and 30 mL of water, and the organic phase was separated and concentrated. A resulting concentrated compound was dissolved in 10 mL of toluene, and precipitated with 300 mL of methanol, thereby obtaining 680 mL of polymer A. The polymer A was analyzed using gel permeation chromatography (GPC), and the polymer A was found to have a weight average molecular weight ("M$_w$") of about 1.82×10$^4$ Daltons, a number average molecular weight ("M$_n$") of about 6.59×10$^3$ Daltons, and a molecular weight distribution ("MWD") of about 2.76.

Compound B

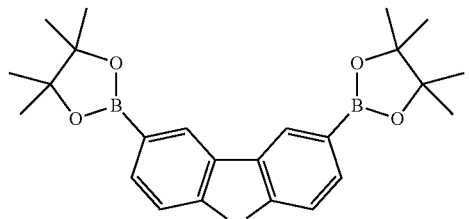

Compound C

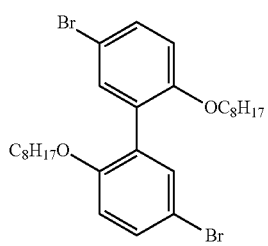

Synthesis Example 2

Synthesis of Polymer D

Polymer D: Polymer Including the Following Common Repeating Unit

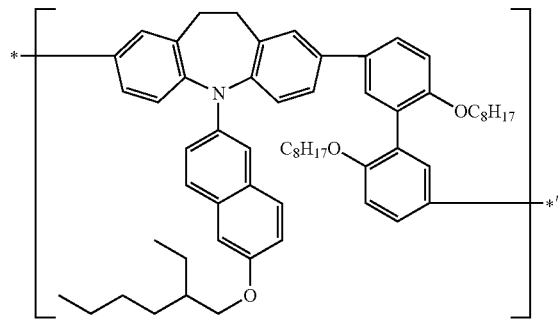

Polymer D was synthesized in the same manner as in Synthesis Example 1, except that Compound E below, instead of Compound B, was used. The polymer D was analyzed using GPC, and the polymer D was found to have a $M_w$ of about $7.34 \times 10^3$ Daltons, a $M_n$ of about $3.50 \times 10^3$ Daltons, and a MWD of about 2.10.

Compound E

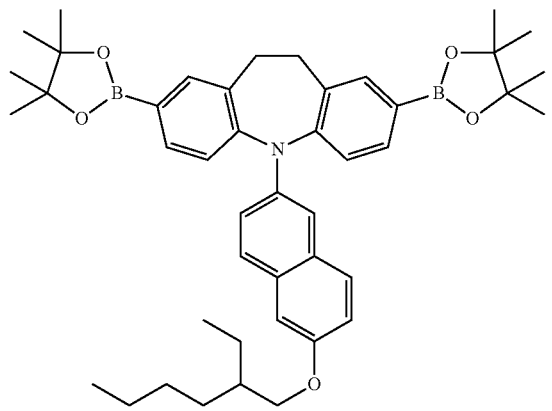

E

Comparative Synthesis Example 3

Synthesis of Polymer F

Polymer F: Polymer including the following common repeating unit

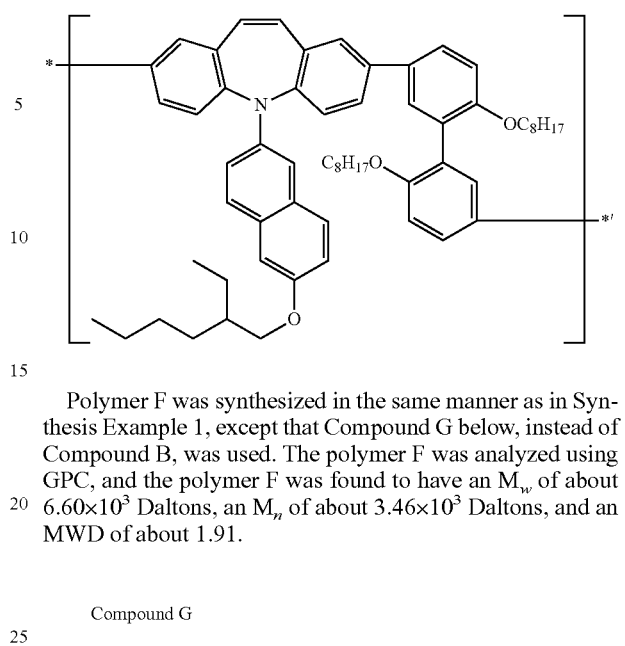

Polymer F was synthesized in the same manner as in Synthesis Example 1, except that Compound G below, instead of Compound B, was used. The polymer F was analyzed using GPC, and the polymer F was found to have an $M_w$ of about $6.60 \times 10^3$ Daltons, an $M_n$ of about $3.46 \times 10^3$ Daltons, and an MWD of about 1.91.

Compound G

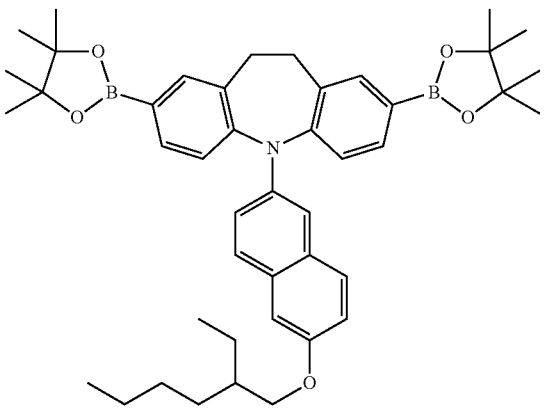

G

Synthesis Example 4

Synthesis of Polymer H

Polymer H: Polymer Including the Following Common Repeating Unit

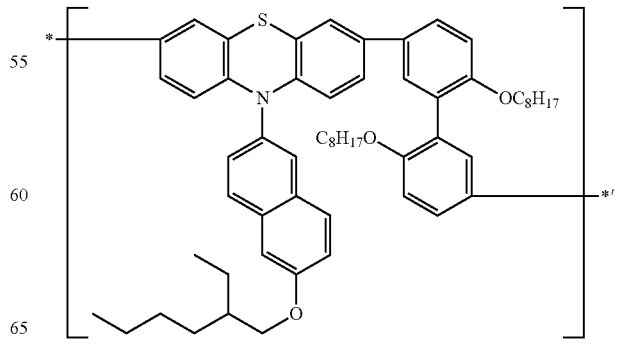

Polymer H was synthesized in the same manner as in Synthesis Example 1, except that Compound I below, instead of Compound B, was used. The polymer H was analyzed using GPC, and the polymer H was found to have an $M_w$ of about $8.05 \times 10^3$ Daltons, an $M_n$ of about $4.33 \times 10^3$ Daltons, and an MWD of about 1.86.

Compound I

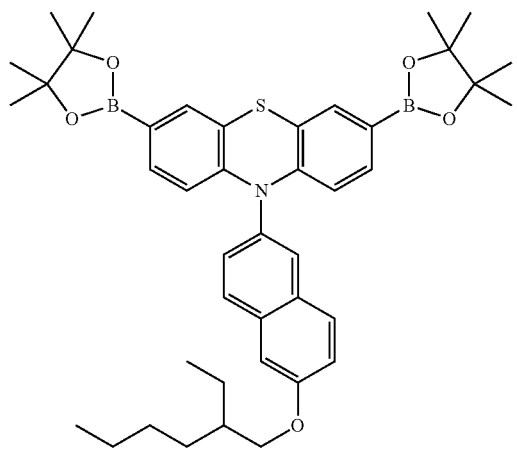

I

Synthesis Example 5

Synthesis of Polymer J

Polymer J: Polymer Including the Following Common Repeating Unit

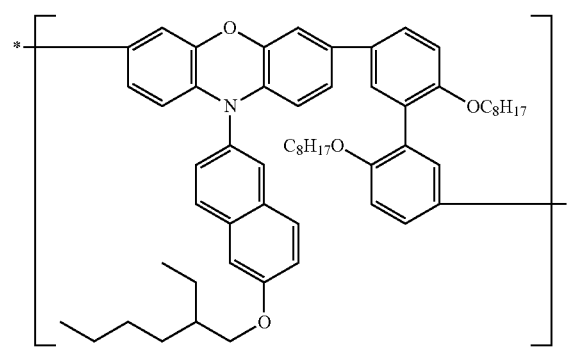

Polymer J was synthesized in the same manner as in Synthesis Example 1, except that Compound K below, instead of Compound B, was used. The polymer J was analyzed using GPC, and the polymer J was found to have an $M_w$ of about $2.34 \times 10^4$ Daltons, an $M_n$ of about $1.09 \times 10^4$ Daltons, and an MWD of about 2.15.

Compound K

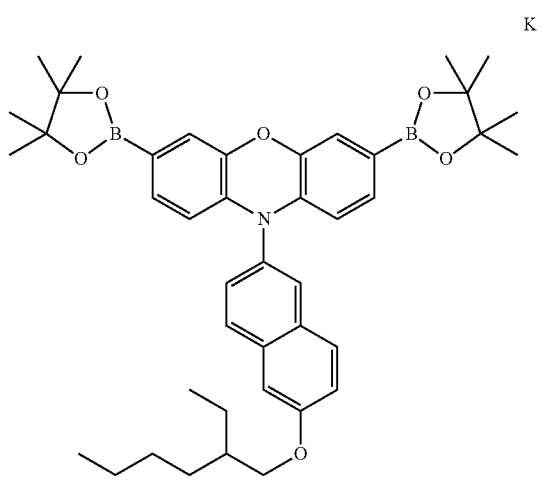

K

Synthesis Example 5

Synthesis of Polymer L

Polymer L: Polymer Including the Following Common Repeating Unit

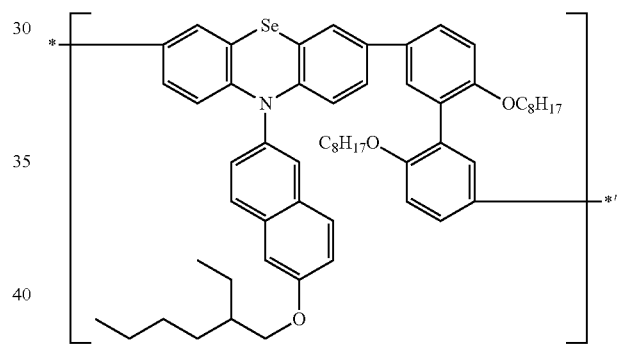

Polymer L was synthesized in the same manner as in Synthesis Example 1, except that Compound M below, instead of Compound B, was used. The polymer L using GPC, and the polymer L was found to have a $M_w$ of about $8.66 \times 10^3$ Daltons, a $M_n$ of about $4.37 \times 10^3$ Daltons, and a MWD of about 1.98.

Compound M

M

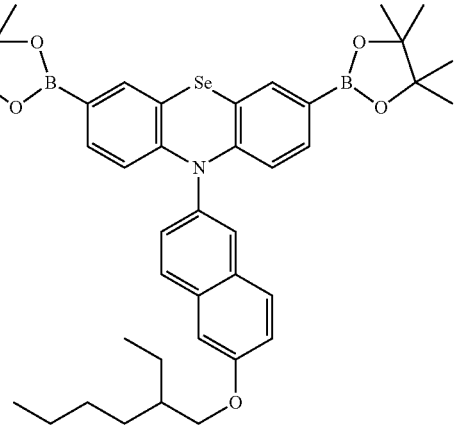

Evaluation Example 1
Estimation of $\chi_{50}\%$, Dihedral Angle, and Triplet State Energy ($E_{T1}$) of Polymers
Two consecutive common repeating units in the main chain of the polymers A, D, and F are represented by Formulas A, D, and F:
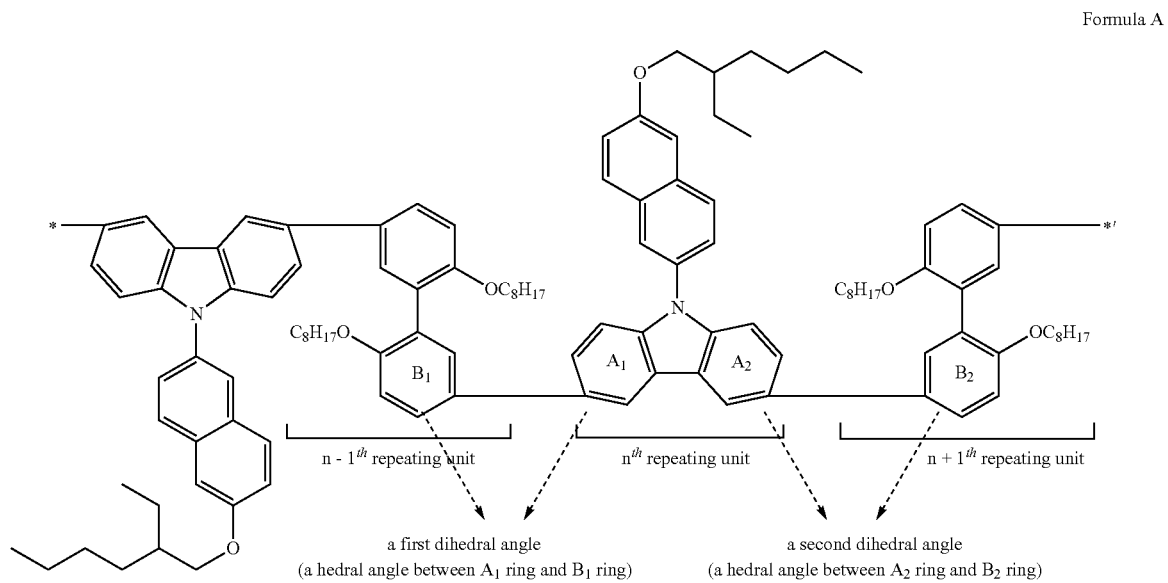
Formula A
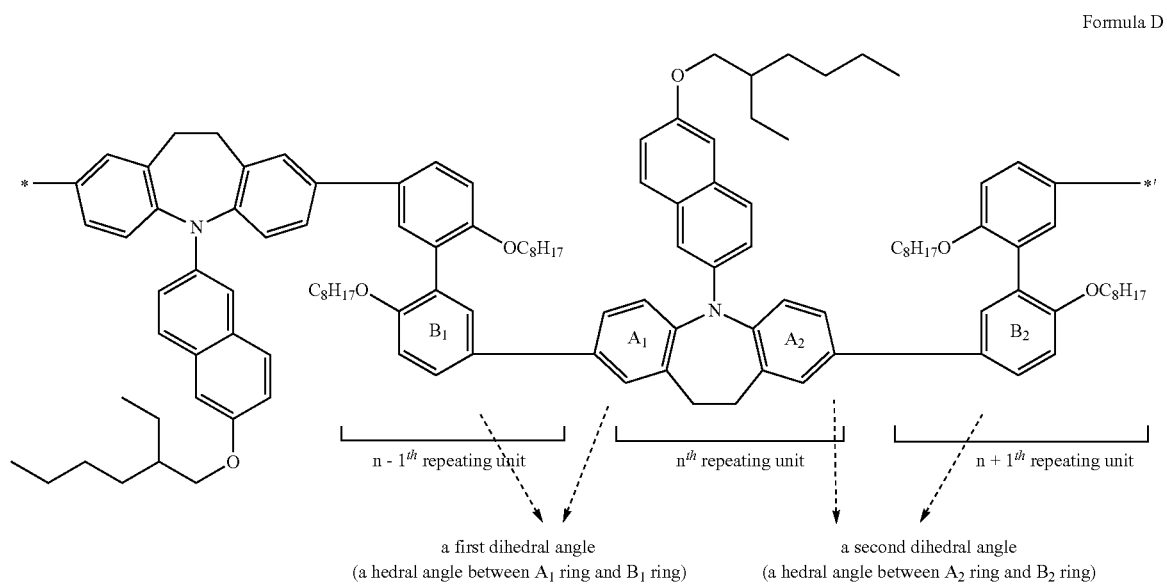
Formula D -continued Formula F

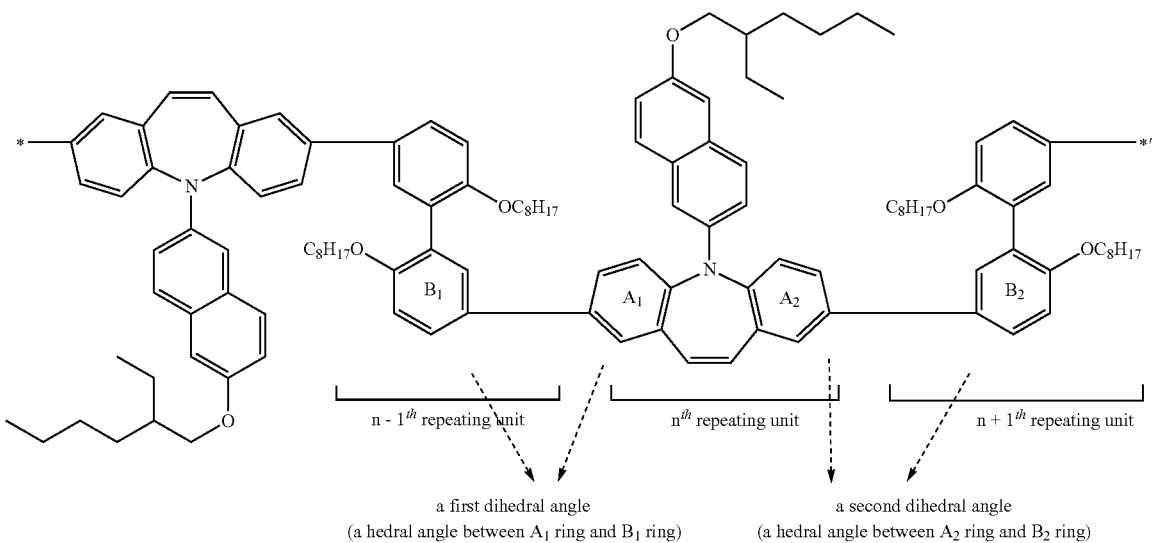

a first dihedral angle
(a hedral angle between A₁ ring and B₁ ring)

a second dihedral angle
(a hedral angle between A₂ ring and B₂ ring)

With regard to the polymers A, D, and F, respectively, having units represented by Formulae A, D, and F, φ and θ in the $n^{th}$ repeating unit, a first dihedral angle, a second dihedral angle, and triplet state energy ($E_{T1}$) in ("eV"), are estimated using methods described in Table 2 below. The results are shown in Table 3. $\chi_{50\%}$ in Table 3 was calculated according to Equation 1 above.

TABLE 2

| Parameter | Estimation method |
| --- | --- |
| φ and θ | Using DFT with (B3LYP/6-31 + G(d)), i.e., with the xc-functional of B3LYP/6-31 + G(D) and a basis set. |
| First dihedral angle & Second dihedral angle | Using DFT with (B3LYP/6-31 + G(d)), i.e., with the xc-functional of B3LYP/6-31 + G(D) and a basis set. |
| Triplet state energy($E_{T1}$) | Using TDDFT with (B3LYP/6-31 + G(d), i.e., with the xc-functional of B3LYP/6-31 + G(D) and a basis set; or by analyzing only low-temperature peaks (relative to room temperature) from photoluminescence ("PL") spectra of a mixture of a target polymer and toluene (1 mg of the polymer dissolved in 3 cubic centimeters ("cc") of toluene), wherein the mixture is contained in a quartz cell, placed in liquid nitrogen (77 K), and analyzed using a PL analyzer. |

TABLE 3

| Polymer No. | φ (°) | θ (°) | $\chi_{50\%}$ (°) | First dihedral angle & Second dihedral angle(°) | $E_{T1}$ (eV) |
| --- | --- | --- | --- | --- | --- |
| A | 180.00 | −33.45 | 28.08 | 38.6 | 2.56 |
| D | 159.37 | 33.52 | 39.08 | 39.2 | 2.45 |
| F | 145.48 | 28.28 | 37.50 | 31.3 | 1.81 |

Referring to Table 3, the Polymers A and D were found to have a first dihedral angle and a second dihedral angle that are greater than $\chi_{50\%}$ of Polymers A and D, respectively, and a high triplet state energy relative to the polymer F, whereas the polymer F has a first dihedral angle and a second dihedral angle that are less than $\chi_{50\%}$ of Polymer F and a relatively low triplet state energy.

Evaluation Example 2

Evaluation of Light-emitting Properties of Polymers (In Solution)

Light-emitting properties of the polymer A were evaluated using PL spectra. First, the polymer A was diluted to a concentration of 10 millimolar (mM) with toluene, and the photoluminescence ("PL") of the solution was measured using an ISC PC1 Spectrofluorometer equipped with a Xenon lamp.

Figure 2:
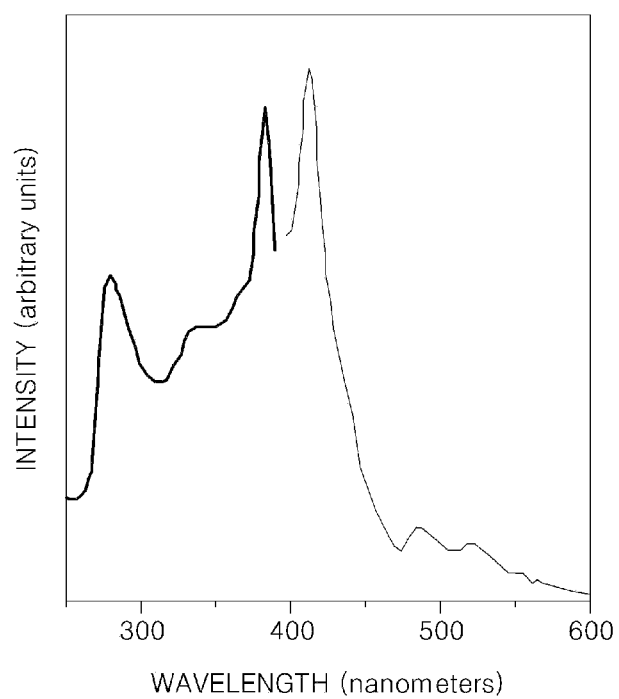
FIG. 2 is a graph of photoluminescence ("PL") spectrum data illustrating [intensity (arbitrary unit)] versus [wavelength (nanometers)] of a polymer A synthesized according to Synthesis Example 1.
Figure 3:
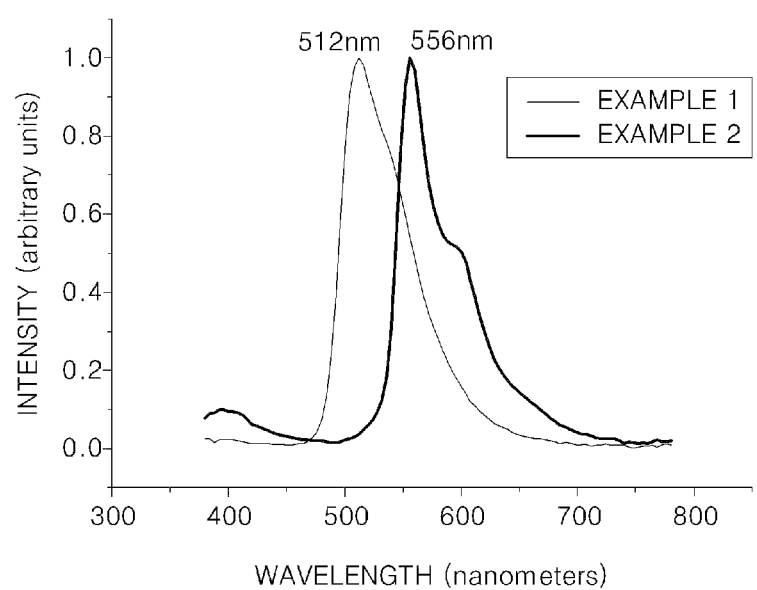
FIG. 3 is a graph of electroluminescence ("EL") spectrum data illustrating [intensity (arbitrary unit)] versus [wavelength (nanometers)] of organic light-emitting devices manufactured according to Examples 1 and 2.
Figure 4:
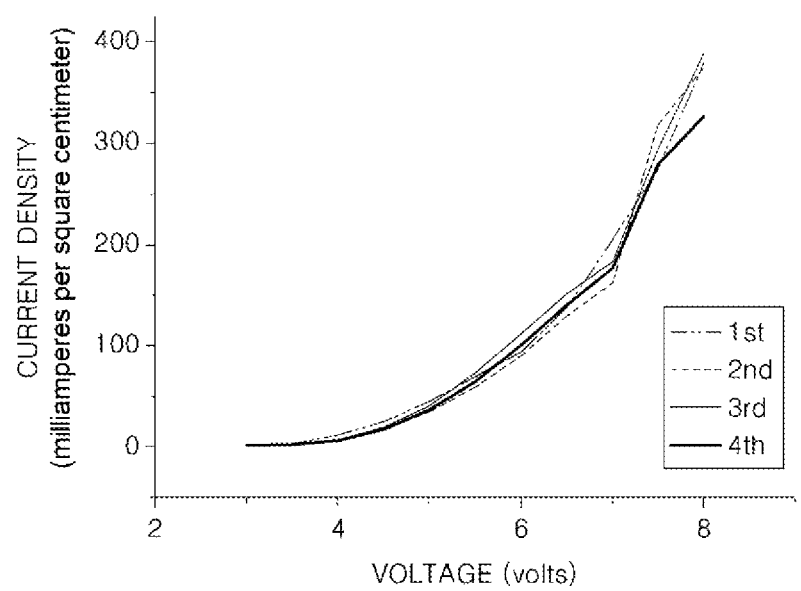
FIG. 4 is a graph illustrating [current density (milliamperes per square centimeter)] versus [voltage (volts)] of the organic light-emitting device manufactured according to Example 1 (4 measurement times)
Figure 5:
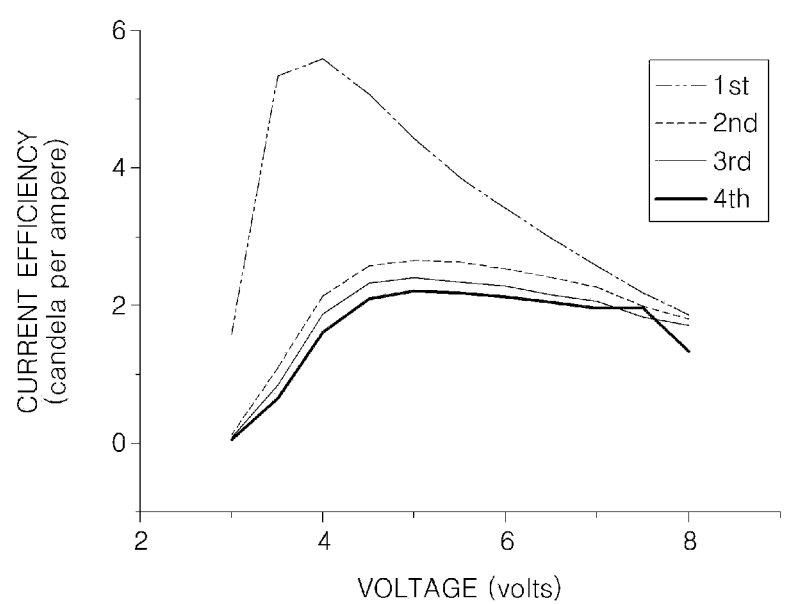
FIG. 5 is a graph illustrating [current efficiency (candela per ampere)] versus [voltage (volts)] of the organic light-emitting device manufactured according to Example 1 (4 measurement times)
Figure 6:
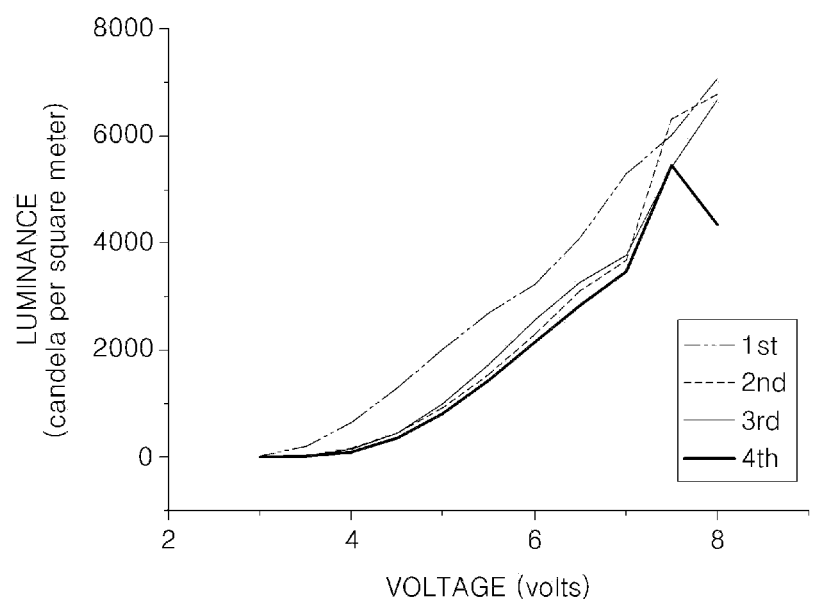
FIG. 6 is a graph illustrating [luminance (candela per square meter)] versus [voltage (volts)] of the organic light-emitting device manufactured according to Example 1 (4 measurement times)
Figure 7:
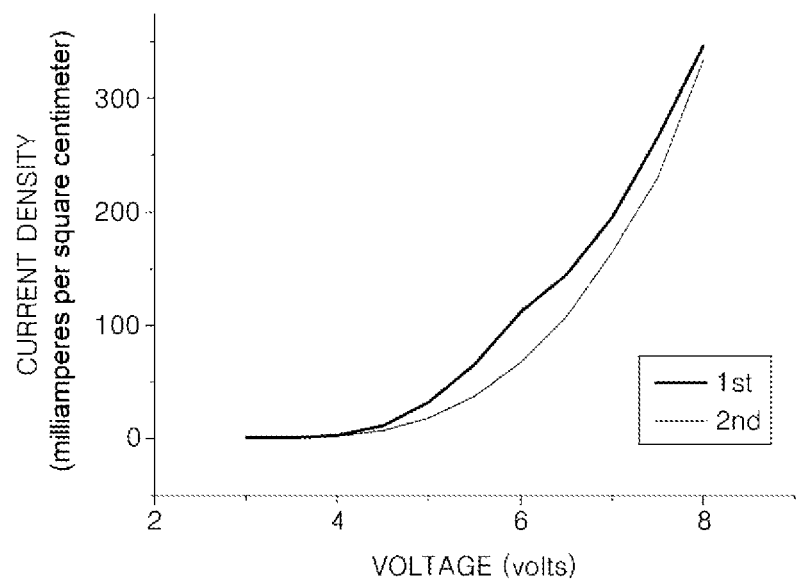
FIG. 7 is a graph illustrating [current density (milliampere per square centimeter)] versus [voltage (volts)] of the organic light-emitting device manufactured according to Example 2 (2 measurement times)
Figure 8:
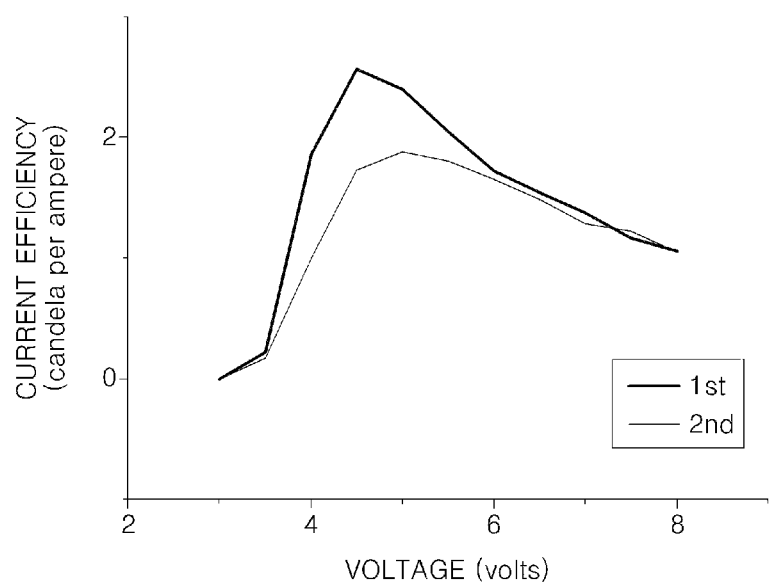
FIG. 8 is a graph illustrating [current efficiency (candela per ampere)] versus [voltage (volts)] of the organic light-emitting device manufactured according to Example 2 (2 measurement times)
Figure 9:
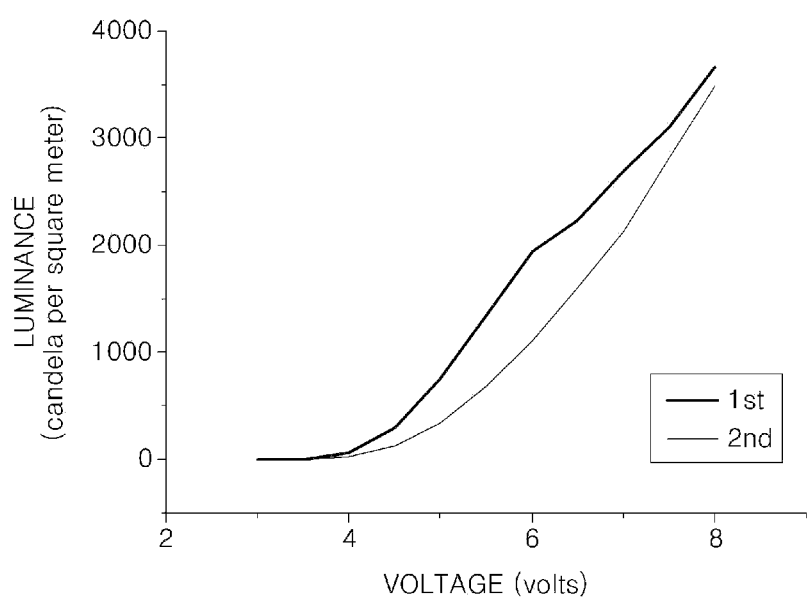
FIG. 9 is a graph illustrating [luminance (candela per square meter)] versus [voltage (volts)] of the organic light-emitting device manufactured according to Example 2 (2 measurement times)
Figure 10:
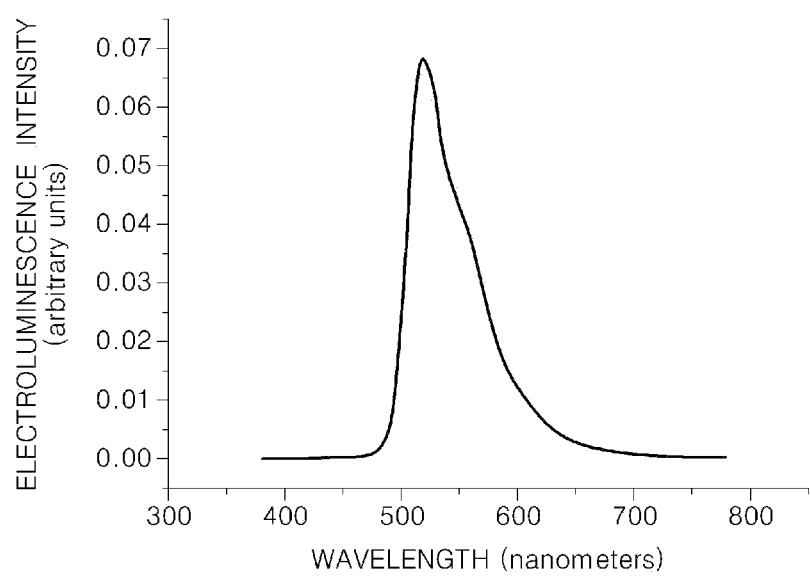
FIG. 10 is a graph of electroluminescence ("EL") spectra illustrating [intensity (arbitrary unit)] versus [wavelength (nanometers)] of an organic light-emitting device manufactured according to Example 3.
Figure 11:
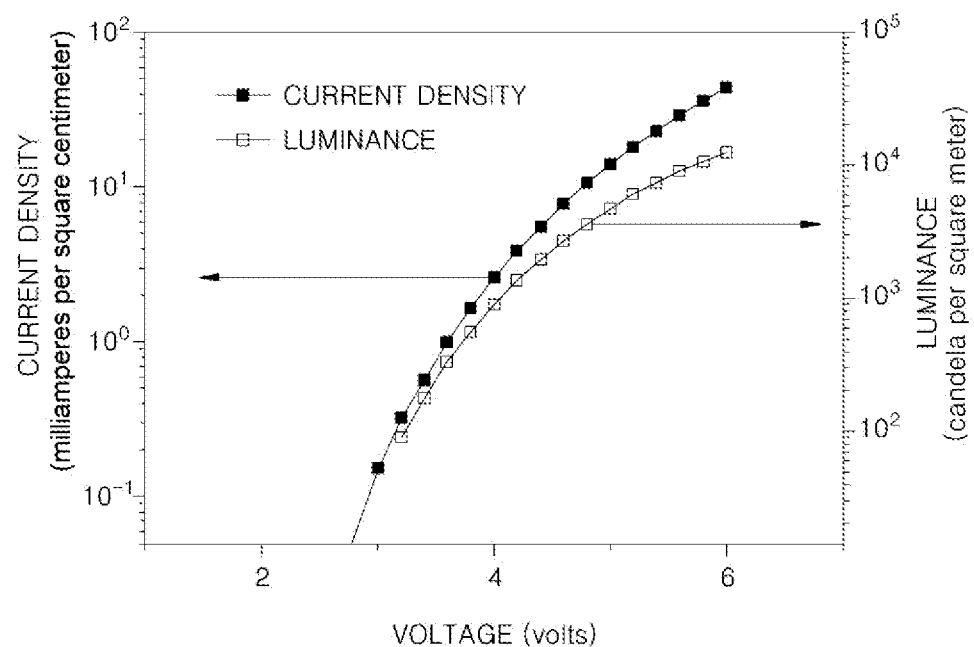
FIG. 11 is a graph illustrating [current density (milliamperes per square centimeter)] versus [voltage (volts)] and [luminance (candela per square meter)] versus [voltage (volts)] of the organic light-emitting device manufactured according to Example 3.
Figure 12:
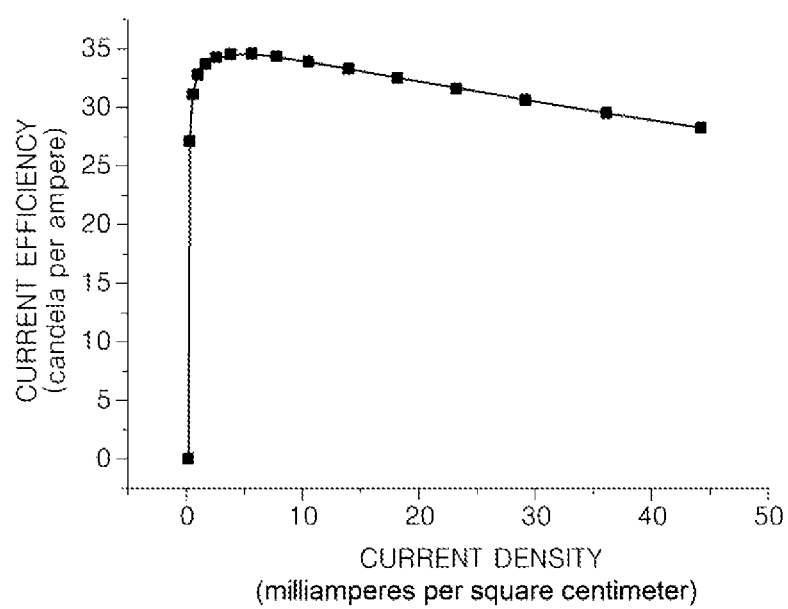
FIG. 12 is a graph illustrating [current efficiency (candela per ampere)] versus [wavelength (nanometers)] of the organic light-emitting device manufactured according to Example 3.

FIG. 2 shows that the polymer A in the solution has improved light-emitting characteristics.

Example 1

Manufacture of an Organic Light-emitting Device including Polymer A and Dopant 1

First, a transparent electrode substrate formed by coating a glass substrate with indium-tin oxide ("ITO") was cleaned. Then, the ITO layer was patterned using a photosensitive resin and an etchant into a desired pattern, followed by further cleaning. An HTL composition (Batron P 4083, available from Bayer AG) containing 3,4-ethylenedioxythiopene ("PEDOT") was coated on the ITO layer and baked at about 200° C. for about 0.5 hours to form an HTL. An EML composition containing the polymer A and 0.7 wt % of Dopant 1 in chlorobenzene was spin-coated on the HTL and baked at about 120° C. for 30 minutes to form an EML containing the polymer A and Dopant 1. The HTL composition and the EML composition were filtered using a 0.2-mm filter prior to the coating. The concentrations and coating rates of the HTL composition and the EML compositions were adjusted to form an HTL and an EML having a thickness of about 55 nm and about 40 nm, respectively. TPBi was vacuum-deposited on the EML at a pressure of 4×10⁻⁶ torr or less to form an ETL having a thickness of about 30 nm. Then, LiF and Al were sequentially deposited on the ETL to form an EIL having a thickness of about 0.5 nm and a second electrode having a thickness of about 100 nm, thereby manufacturing the OLED.

The thickness and growth rate of each of the layers were adjusted using a crystal sensor during the deposition process.

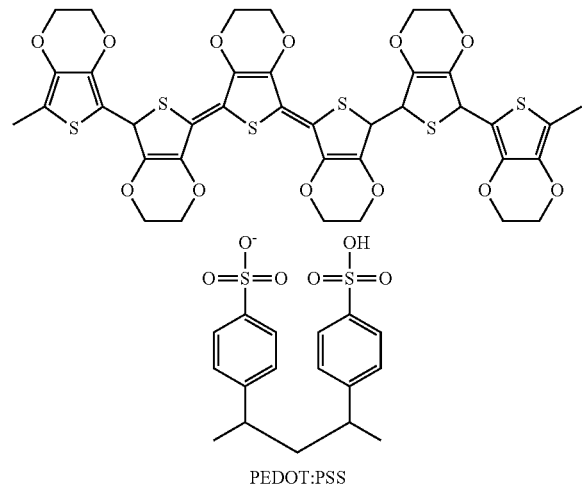

PEDOT:PSS

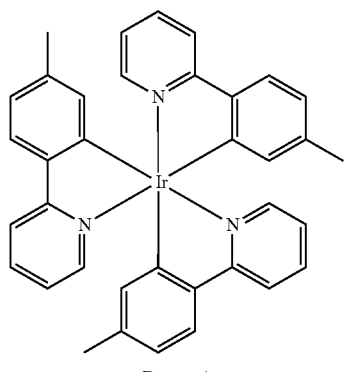

Dopant 1

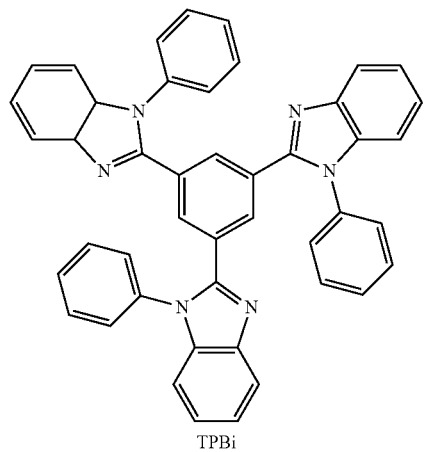

TPBi

Example 2

Manufacture of an Organic Light-emitting Device including Polymer A and Dopant 2

An OLED was manufactured in the same manner as in Example 1, except that Dopant 2, instead of Dopant 1, was used to form the EML.

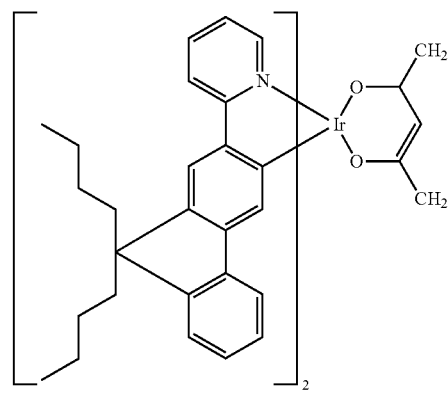

Dopant 2

Example 3

Manufacture of an Organic Light-emitting Device including Polymer D and Dopant 1

An OLED was manufactured in the same manner as in Example 1, except that Polymer D, instead of Polymer A, was used to form the EML.

The structures of the OLEDs of Examples 1 to 3 are summarized in Table 1 below.

TABLE 4

| | Anode | HTL | Emission layer | ETL | EIL/ Cathode |
|---|---|---|---|---|---|
| Example 1 | ITO (150 nm) | PEDOT: PSS (55 nm) | Polymer A: Dopant 1 (0.7 wt %) (40 nm) | TPBi (30 nm) | LiF(0.5 nm)/ Al (100 nm) |
| Example 2 | ITO (150 nm) | PEDOT: PSS (55 nm) | Polymer A: Dopant 2 (0.7 wt %) (40 nm) | TPBi (30 nm) | LiF (0.5 nm)/ Al(100 nm) |
| Example 3 | ITO (150 nm) | PEDOT: PSS (55 nm) | Polymer D: Dopant 1 (0.7 wt %) (40 nm) | TPBi (30 nm) | LiF(0.5 nm)/ Al (100 nm) |

Evaluation Example 3

Evaluation of Characteristics of OLEDs

Electroluminescence spectrum, current density, current efficiency, and luminance of the OLEDs of Examples 1 to 3 were evaluated using a PR650 Spectroscan Source Measurement Unit (available from PhotoResearch). The results are shown in FIGS. 3 to 12.

Referring to FIGS. 3 to 12, the OLEDs of Examples 1 to 3 including the polymer A or D were found to have improved current density and luminance characteristics.

As described above, according to an embodiment, a polymer including a repeating unit of Formula 1 above may have a high triplet state energy level, and thus an OLED including the polymer may have high current density and high luminance characteristics.

It should be understood that the exemplary embodiments described herein should be considered in a descriptive sense only and not for purposes of limitation. Descriptions of features or aspects within each embodiment should be considered as available for other similar features or aspects in other embodiments.

What is claimed is:

1. A polymer comprising m repeating units,
wherein an $n^{th}$ repeating unit of the m repeating units is a first repeating unit represented by Formula 1 below,
wherein at least one of a first dihedral angle between an $A_1$ ring of the $n^{th}$ repeating unit and a first aromatic ring of an $(n-1)^{th}$ repeating unit and a second dihedral angle between an $A_2$ ring of the $n^{th}$ repeating unit and a second aromatic ring of a $(n+1)^{th}$ repeating unit is equal to or greater than an angle of $\chi_{50\%}$ represented by Equation 1:

Formula 1

$$\chi_{50\%} = A + B(\phi + 4\theta)$$ Equation 1 wherein
the first aromatic ring is bound to the $A_1$ ring by a single bond;
the second aromatic ring is bound to the $A_2$ ring by a single bond;
$R_1$ to $R_7$ of Formula 1 are the same or different in each repeating unit and are each independently a hydrogen atom, a deuterium atom, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_2$-$C_{60}$ cycloalkynyl group, a substituted or unsubstituted $C_3$-$C_{60}$ heterocycloalkyl group, a substituted or unsubstituted $C_3$-$C_{60}$ heterocycloalkenyl group, a substituted or unsubstituted $C_2$-$C_{60}$ heterocycloalkynyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted $C_2$-$C_{60}$ heteroaryloxy group, a substituted or unsubstituted $C_2$-$C_{60}$ heteroarylthio group, an isocyanate group, a (meth)acrylate group, —N($Q_1$)($Q_2$), —Si($Q_3$)($Q_4$)($Q_6$) (wherein $Q_i$ to $Q_5$ are each independently a hydrogen, a deuterium atom, a halogen atom, a hydroxyl group, a cyano group, a nitro group, a carboxyl group, a $C_1$-$C_{60}$ alkyl group, a $C_2$-$C_{60}$ alkenyl group, a $C_2$-$C_{60}$ alkynyl group, a $C_3$-$C_{60}$ cycloalkyl group, a $C_6$-$C_{60}$ aryl group, a $C_2$-$C_{60}$ heteroaryl group, or a combination thereof), -($Q_6$)O($Q_7$) (wherein $Q_6$ is a substituted or unsubstituted $C_1$-$C_{60}$ alkylene group and $Q_7$ is a hydrogen or a substituted or unsubstituted $C_1$-$C_{60}$ alkyl group), or a combination thereof;
X of Formula 1 is the same or different in each repeating unit and is each independently absent, or a linker comprising a $C_1$-$C_7$ substituted or unsubstituted alkylene group or a Group 16 element;
m is an integer from 2 to 1000;
n is a variable from 2 to m−1;
A of Equation 1 is 26.03, and B is 0.0445;
φ of Equation 1 is an angle between the $A_1$ ring and $A_2$ ring of Formula 1, as illustrated in Formula 1-1 below; and
θ of Equation 1 is an angle between a first imaginary line extending from a bond between the $A_1$ ring and a $A_3$ ring of Formula 1 in a direction close to nitrogen of the $A_3$ ring and a second imaginary line extending from a bond between the $A_2$ ring and $A_3$ ring in a direction close to the nitrogen of the $A_3$ ring, as illustrated in Formula 1-2 below Formula 1-1

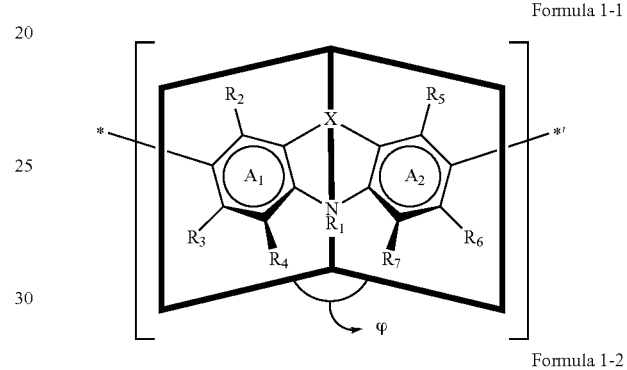

Formula 1-2

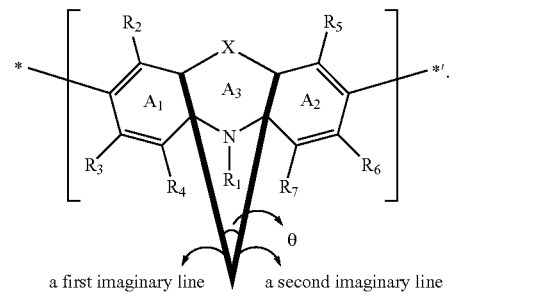

wherein the first dihedral angle, the second dihedral angle, φ of Equation 1, and θ of Equation 1 are calculated by application of density functional theory with a B3LYP/6-31+G(D) basis set, and
wherein the polymer further comprises a second repeating unit represented by Formula 5A, 5B, 5D, or 5E:

Formula 5A

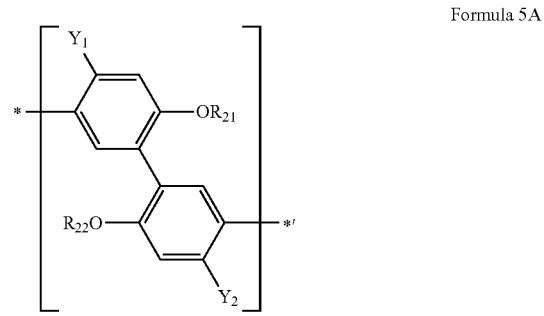

-continued

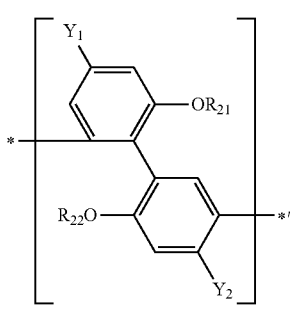
Formula 5B

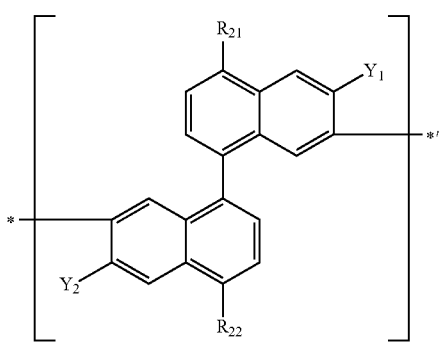
Formula 5D

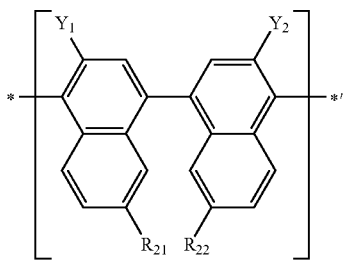
Formula 5E wherein, in Formulae 5A, 5B, 5D, and 5E, $R_{21}$ and $R_{22}$ are each independently a substituted or unsubstituted $C_1$-$C_{60}$ alkyl group; and $Y_1$ to $Y_4$ are each independently a hydrogen, a substituted or unsubstituted $C_1$-$C_{60}$ alkyl group, a substituted or unsubstituted $C_1$-$C_{60}$ alkoxy group, or a combination thereof.

2. The polymer of claim 1, wherein X is the linker represented by Formula 2-2 below; $158.37 \leq \phi \leq 160.37$; $32.52 \leq \theta \leq 34.52$; and $38.00 \leq \chi_{50\%} \leq 40.00$:

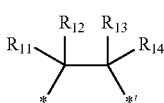
Formula 2-2 wherein $R_{11}$ to $R_{14}$ of Formula 2-2 are each independently a hydrogen, a deuterium atom, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_2$-$C_{60}$ cycloalkynyl group, a substituted or unsubstituted $C_3$-$C_{60}$ heterocycloalkyl group, a substituted or unsubstituted $C_3$-$C_{60}$ heterocycloalkenyl group, a substituted or unsubstituted $C_2$-$C_{60}$ heterocycloalkynyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted $C_2$-$C_{60}$ heteroaryloxy group, a substituted or unsubstituted $C_2$-$C_{60}$ heteroarylthio group, an isocyanate group, a (meth)acrylate group, or a combination thereof.

3. The polymer of claim 2, wherein $R_{11}$ to $R_{14}$ of Formula 2-2 are each independently a hydrogen atom; a deuterium atom; F; Cl; a hydroxyl group; a cyano group; a nitro group; a carboxyl group; a methyl group; an ethyl group; a propyl group; an i-propyl group; a butyl group; an i-butyl group; a t-butyl group; a pentyl group;

a hexyl group; a heptyl group; an octyl group; a 2-ethylhexyl group; a nonyl group; a decyl group; a 3,7-dimethyloctyl group; a methoxy group; an ethoxy group; a propyloxy group; an i-propyloxy group; a butoxy group; an i-butoxy group; a t-butoxy group; a pentyloxy group; a hexyloxy group; a heptyloxy group; an octyloxy group; a 2-ethylhexyloxy group; a nonyloxy group; a decyloxy group; a 3,7-dimethyloctyloxy group;

or a substituted group that is a methyl group, an ethyl group, a propyl group, an i-propyl group, a butyl group, an i-butyl group, a t-butyl group, a pentyl group, a hexyl group, a heptyl group, an octyl group, a 2-ethylhexyl group, a nonyl group, a decyl group, 3,7-dimethyloctyl group, a methoxy group, an ethoxy group, a propyloxy group, an i-propyloxy group, a butoxy group, a i-butoxy group, a t-butoxy group, a pentyloxy group, a hexyloxy group, a heptyloxy group, an octyloxy group, a 2-ethylhexyloxy group, a nonyloxy group, a decyloxy group, or a 3,7-dimethyloctyloxy group that are each substituted with a deuterium atom, —F, —Cl, a hydroxyl group, a cyano group, a nitro group, a carboxyl group, or a combination thereof.

4. The polymer of claim 1, wherein X is absent; $\phi=180.00$; $-34.45 \leq \theta \leq -32.45$; and $27.00 \leq \chi_{50\%} \leq 29.00$.

5. The polymer of claim 1, wherein X is the linker represented by the Group 16 element —O—; $167.18 \leq \phi \leq 169.18$; $-2.81 \leq \theta \leq 0.81$; and $32.00 \leq \chi_{50\%} \leq 34.00$.

6. The polymer of claim 1, wherein X is the linker represented by the Group 16 element —S—; $149.27 \leq \phi \leq 151.27$; $10.01 \leq \theta \leq 12.01$; and $34.00 \leq \chi_{50\%} \leq 36.00$.

7. The polymer of claim 1, wherein X is the linker represented by the Group 16 element —Se—; $145.94 \leq \phi \leq 147.94$; $14.46 \leq \theta \leq 16.46$; and $34.00 \leq \chi_{50\%} \leq 36.00$.

8. The polymer of claim 1, wherein, in Formula 1, $R_2$ to $R_7$ are each a hydrogen, and $R_1$ is represented by Formula 3A, 3B, 3C, 3D, 3E, 3F, 3G, 3H, or 3I:

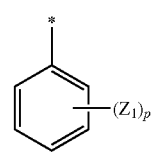
Formula 3A

-continued

Formula 3B
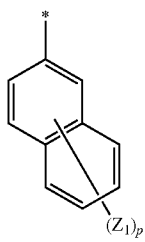

Formula 3C
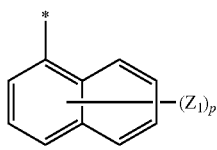

Formula 3D
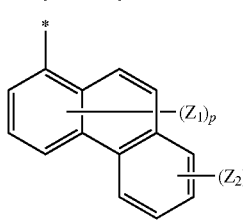

Formula 3E
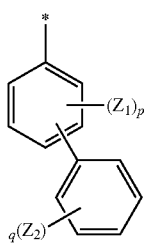

Formula 3F
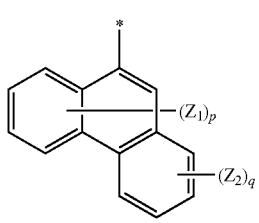

Formula 3G
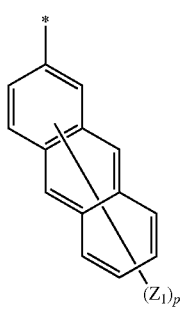

Formula 3H
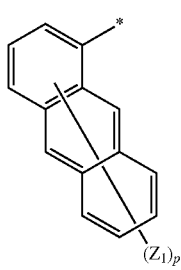

Formula 3I
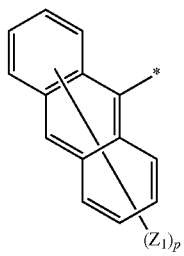

wherein in Formulae 3A to 3I, $Z_1$ and $Z_2$ are each independently a deuterium atom, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloal kenyl group, a substituted or unsubstituted $C_2$-$C_{60}$ cycloalkynyl group, a substituted or unsubstituted $C_3$-$C_{60}$ heterocycloalkyl group, a substituted or unsubstituted $C_3$-$C_{60}$ heterocycloalkenyl group, a substituted or unsubstituted $C_2$-$C_{60}$ heterocycloalkynyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group, a substituted or unsubstituted $C_2$-$C_{60}$ heteroaryloxy group, a substituted or unsubstituted $C_2$-$C_{60}$ heteroarylthio group, an isocyanate group, a (meth)acrylate group, or a combination thereof;

p is an integer from 0 to 9; and q is an integer from 0 to 4.

9. The polymer of claim 1, wherein in Formula 1, $R_2$ to $R_7$ are each a hydrogen, and $R_1$ of Formula 1 is represented by Formula 4A:

Formula 4A
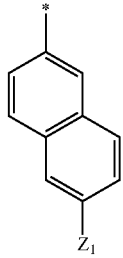

wherein $Z_1$ of Formula 4A is a deuterium atom; —F; —Cl; a hydroxyl group; a cyano group; a nitro group; a carboxyl group; a methyl group; an ethyl group; a propyl group; an i-propyl group; a butyl group; an i-butyl group; a t-butyl group; a pentyl group; a hexyl group; a heptyl group; an octyl group; a 2-ethylhexyl group; a nonyl group; a decyl group; a 3,7-dimethyloctyl group; a methoxy group; an ethoxy group; a propyloxy group; an i-propyloxy group; a butoxy group; an i-butoxy group; a t-butoxy group; a pentyloxy group; a hexyloxy group; a heptyloxy group; an octyloxy group; a 2-ethylhexyloxy group; a nonyloxy group; a decyloxy group; a 3,7-dimethyloctyloxy group; or a methyl group, an ethyl group, a propyl group, an i-propyl group, a butyl group, an i-butyl group, a t-butyl group, a pentyl group, a hexyl group, a heptyl group, an octyl group, a 2-ethylhexyl group, a nonyl group, a decyl group, a 3,7-dimethyloctyl group, a methoxy group, an ethoxy group, a propyloxy group, an i-propyloxy group, a butoxy group, an i-butoxy group, a t-butoxy group, a pentyloxy group, a hexyloxy group, a heptyloxy group, an octyloxy group, a 2-ethylhexyloxy group, a nonyloxy group, a decyloxy group, or a 3,7-dimethyloctyloxy group that are each substituted with a deuterium atom, —F, —Cl, a hydroxyl group, a cyano group, a nitro group, a carboxyl group, or a combination thereof.

10. The polymer of claim 1, wherein $R_{21}$ and $R_{22}$ are each independently a methyl group; an ethyl group; a propyl group; an i-propyl group; a butyl group; an i-butyl group; a t-butyl group; a pentyl group; a hexyl group; a heptyl group; an octyl group; a 2-ethylhexyl group; a nonyl group; a decyl group; a 3,7-dimethyloctyl group; or a substituted group that is a methyl group, an ethyl group, a propyl group, an i-propyl group, a butyl group, an i-butyl group, a t-butyl group, a pentyl group, a hexyl group, a heptyl group, an octyl group, a 2-ethylhexyl group, a nonyl group, a decyl group, or a 3,7-dimethyloctyl group, that are each substituted with a deuterium atom, —F, —Cl, a hydroxyl group, a cyano group, a nitro group, a carboxyl group, or a combination thereof.

11. The polymer of claim 1, wherein the polymer is an alternating polymer comprising the first repeating unit and the second repeating unit.

12. The alternating polymer of claim 11, wherein the first and second repeating units are represented by Formula 6, wherein X in Formula 6 is the same or different in each first repeating unit and is each independently absent, a single bond, or a linker comprising a $C_1$ to $C_7$ substituted or unsubstituted alkylene group or a Group 16 element;

$R_1$ in Formula 6 is the same or different in each first repeating unit and is each independently a hydrogen, a deuterium, a halogen, a hydroxyl group, a cyano group, a nitro group, a carboxyl group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ cycloalkyl group, a $C_3$-$C_{60}$ cycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, —$N(Q_1)(Q_2)$, and —$Si(Q_3)(Q_4)(Q_5)$ (wherein $Q_1$ to $Q_5$ are each independently a hydrogen, a deuterium, a halogen, a hydroxyl group, a cyano group, a nitro group, a carboxyl group, a $C_1$-$C_{60}$ alkyl group, a $C_2$-$C_{60}$ alkenyl group, a $C_2$-$C_{60}$ alkynyl group, a $C_3$-$C_{60}$ cycloalkyl group, a $C_6$-$C_{60}$ aryl group, or a $C_2$-$C_{60}$ heteroaryl group); each optionally substituted with a hydrogen; a deuterium; —F; —Cl; a hydroxyl group; a cyano group; a nitro group; a carboxyl group; a substituted or unsubstituted methyl group; a substituted or unsubstituted ethyl group; a substituted or unsubstituted propyl group; a substituted or unsubstituted i-propyl group; a substituted or unsubstituted butyl group; a substituted or unsubstituted i-butyl group; a substituted or unsubstituted t-butyl group; a substituted or unsubstituted pentyl group; a substituted or unsubstituted hexyl group; a substituted or unsubstituted heptyl group; a substituted or unsubstituted octyl group; a substituted or unsubstituted 2-ethylhexyl group; a substituted or unsubstituted nonyl group; a substituted or unsubstituted decyl group; a substituted or unsubstituted 3,7-dimethyloctyl group; a substituted or unsubstituted methoxy group; a substituted or unsubstituted ethoxy group; a substituted or unsubstituted propyloxy group; a substituted or unsubstituted i-propyloxy group; a substituted or unsubstituted butoxy group; a substituted or unsubstituted i-butoxy group; a substituted or unsubstituted t-butoxy group; a substituted or unsubstituted pentyloxy group; a substituted or unsubstituted hexyloxy group; a substituted or unsubstituted heptyloxy group; a substituted or unsubstituted octyloxy group; a substituted or unsubstituted 2-ethylhexyloxy group; a substituted or unsubstituted nonyloxy group; a substituted or unsubstituted decyloxy group; a substituted or unsubstituted 3,7-dimethyloctyloxy group, or a combination thereof, $R_{21}$ and $R_{22}$ in Formula 6 is the same or different in each second repeating unit and is each independently a substituted or unsubstituted methyl group; a substituted or unsubstituted ethyl group; a substituted or unsubstituted propyl group; a substituted or unsubstituted i-propyl group; a substituted or unsubstituted butyl group; a substituted or unsubstituted i-butyl group; a substituted or unsubstituted t-butyl group; a substituted or unsubstituted pentyl group; a substituted or unsubstituted hexyl group; a substituted or unsubstituted heptyl group; a substituted or unsubstituted octyl group; a substituted or unsubstituted 2-ethylhexyl group; a substituted or unsubstituted nonyl group; a substituted or unsubstituted decyl group; a substituted or unsubstituted 3,7-dimethyloctyl group;

Formula 6

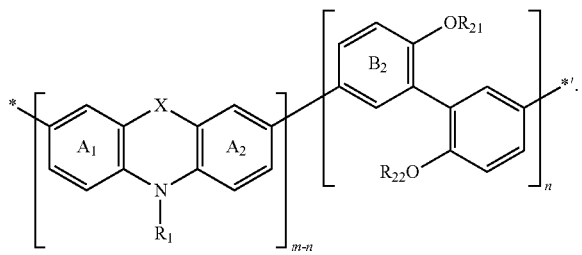

13. The alternating polymer of claim 12, wherein the first and second repeating units form a common repeating unit represented by Formula 6A or 6B:

Formula 6A

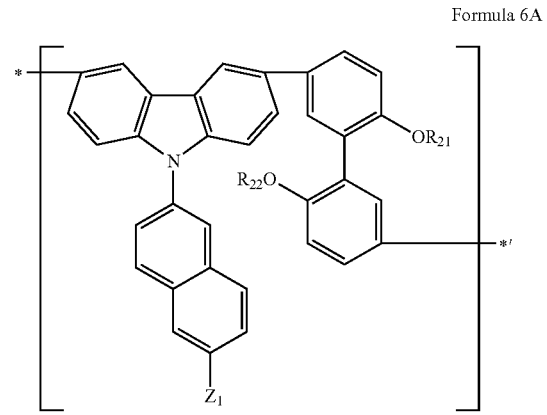

-continued

Formula 6B

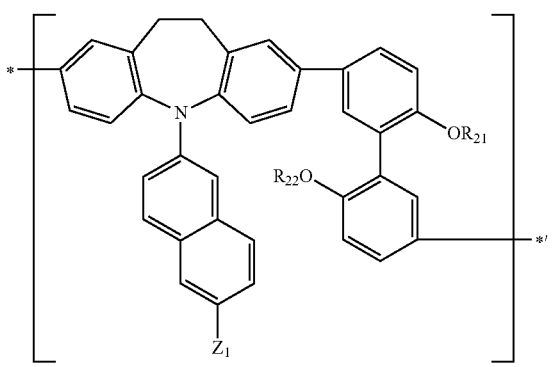

wherein, in Formulae 6A and 6B, $R_{21}$ and $R_{22}$ are each independently a methyl group; an ethyl group; a propyl group; an i-propyl group; a butyl group; an i-butyl group; a t-butyl group; a pentyl group; a hexyl group; a heptyl group; an octyl group; a 2-ethylhexyl group; a nonyl group; a decyl group; a 3,7-dimethyloctyl group; or a substituted group that is a methyl group, an ethyl group, a propyl group, an i-propyl group, a butyl group, an i-butyl group, a t-butyl group, a pentyl group, a hexyl group, a heptyl group, an octyl group, a 2-ethylhexyl group, a nonyl group, a decyl group, or a 3,7-dimethyloctyl group, that are each substituted with a deuterium atom, —F, —Cl, a hydroxyl group, a cyano group, a nitro group, a carboxyl group, or a combination thereof; and $Z_1$ is a hydrogen; a deuterium atom; —F; —Cl; a hydroxyl group; a cyano group; a nitro group; a carboxyl group; a methyl group; an ethyl group; a propyl group; an i-propyl group; a butyl group; an i-butyl group; a t-butyl group; a pentyl group; a hexyl group; a heptyl group; an octyl group; a 2-ethylhexyl group; a nonyl group; a decyl group; a 3,7-dimethyloctyl group; a methoxy group; an ethoxy group; a propyloxy group; an i-propyloxy group; a butoxy group; an i-butoxy group; a t-butoxy group; a pentyloxy group; a hexyloxy group; a heptyloxy group; an octyloxy group; a 2-ethylhexyloxy group; a nonyloxy group; a decyloxy group; a 3,7-dimethyloctyloxy group; or a substituted group that is a methyl group, an ethyl group, a propyl group, an i-propyl group, a butyl group, an i-butyl group, a t-butyl group, a pentyl group, a hexyl group, a heptyl group, an octyl group, a 2-ethylhexyl group, a nonyl group, a decyl group, a 3,7-dimethyloctyl group, a methoxy group, an ethoxy group, a propyloxy group, an i-propyloxy group, a butoxy group, a i-butoxy group, a t-butoxy group, a pentyloxy group, a hexyloxy group, a heptyloxy group, an octyloxy group, a 2-ethylhexyloxy group, a nonyloxy group, a decyloxy group, or a 3,7-dimethyloctyloxy group that are each substituted with a deuterium atom, —F, —Cl, a hydroxyl group, a cyano group, a nitro group, a carboxyl group, or a combination thereof.

14. The polymer of claim 1, wherein the polymer has a weight average molecular weight of about 2,000 Daltons to about 1,000,000 Daltons.

15. The polymer of claim 1, wherein the polymer is a phosphorescent host.

16. An organic light-emitting device comprising:
a substrate;
a first electrode disposed on the substrate;
a second electrode; and
a first layer disposed between the first electrode and the second electrode, the first layer comprising the polymer of claim 1.

17. The organic light-emitting device of claim 16, wherein the first layer is an emission layer, and further comprises a phosphorescent dopant.

18. The organic light-emitting device of claim 17, wherein the phosphorescent dopant comprises an organometallic complex comprising iridium (Ir), platinum (Pt), osmium (Os), rhenium (Re), titanium (Ti), zirconium (Zr), hafnium (Hf), or a combination thereof.

* * * * *